(12) United States Patent
Swaminathan et al.

(10) Patent No.: US 12,381,571 B2
(45) Date of Patent: Aug. 5, 2025

(54) RECONFIGURABLE TRANSMIT DIGITAL-TO-ANALOG CONVERTER (DAC) CIRCUIT

(71) Applicant: QUALCOMM Incorporated, San Diego, CA (US)

(72) Inventors: Ashok Swaminathan, Cardiff, CA (US); Nitz Saputra, Burlingame, CA (US); Negar Rashidi, Mission Viejo, CA (US); Shahin Mehdizad Taleie, San Diego, CA (US); Chinmaya Mishra, San Diego, CA (US); Dongwon Seo, San Diego, CA (US); Jong Hyeon Park, San Jose, CA (US); Sang-June Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 294 days.

(21) Appl. No.: 18/068,941

(22) Filed: Dec. 20, 2022

(65) Prior Publication Data

US 2024/0204795 A1     Jun. 20, 2024

(51) Int. Cl.
*H03M 1/66*     (2006.01)
*H03M 1/82*     (2006.01)

(52) U.S. Cl.
CPC .............. *H03M 1/665* (2013.01); *H03M 1/82* (2013.01)

(58) Field of Classification Search
CPC ................................ H03M 1/665; H03M 1/82
USPC ......................................... 341/144, 145, 172
See application file for complete search history.

(56) References Cited

U.S. PATENT DOCUMENTS

| | | | |
|---|---|---|---|
| 9,413,394 B1 | 8/2016 | Lye et al. | |
| 2007/0290980 A1* | 12/2007 | Lin | ....................... G09G 3/3688 |
| | | | 345/100 |
| 2023/0054999 A1* | 2/2023 | Chakraborty | ......... H03M 1/662 |

OTHER PUBLICATIONS

Beikmirza M., et al., "A1-to-4GHz Multi-Mode Digital Transmitter in 40nm CMOS Supporting 200MHz 1024-QAM OFDM signals with more than 23dBm/66% Peak Power/Drain Efficiency", 2022 IEEE Custom Integrated Circuits Conference (CICC), IEEE, Apr. 24, 2022, pp. 1-2, XP034123722, Figures 2-5.
International Search Report and Written Opinion—PCT/US2023/080398—ISA/EPO—Apr. 12, 2024.
Co-pending U.S. Appl. No. 17/934,495, inventor Leung; Lai, filed Sep. 22, 2022.

* cited by examiner

*Primary Examiner* — Peguy Jean Pierre
(74) *Attorney, Agent, or Firm* — Patterson + Sheridan, L.L.P.

(57) ABSTRACT

Methods and apparatus for sharing digital-to-analog (DAC) converters in a reconfigurable DAC circuit to support two or more transmit chains of a wireless transmitter configured for different radio access technologies (RATs) and/or different transmitter architectures. One example DAC circuit generally includes at least four DACs and a plurality of switches coupled to outputs of the at least four DACs such that the DAC circuit is configured as a multi-channel DAC circuit with at least four channels for a first set of one or more frequency bands and as an interleaved DAC circuit with at least two channels for a second set of one or more frequency bands different from the first set of frequency bands.

29 Claims, 15 Drawing Sheets

RECONFIGURABLE TRANSMIT DIGITAL-TO-ANALOG CONVERTER (DAC) CIRCUIT

TECHNICAL FIELD

Certain aspects of the present disclosure generally relate to electronic circuits and, more particularly, to a reconfigurable digital-to-analog converter (DAC) circuit capable of supporting multiple radio access technologies (RATs), frequency bands, and/or transmitter architectures.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), Cellular Vehicle-to-Everything (C-V2X), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include at least one transceiver, which may include, for example, a plurality of transmit paths designated for transmission using different RATs. Different RATs may use different sets of frequency bands for transmission, and in some cases, a single RAT (e.g., 5G NR) may use different sets of one or more frequency bands.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include reduced digital-to-analog converter (DAC) circuit area (e.g., in a transmitter) and cost, by sharing hardware to support multiple radio access technologies (RATs), frequency bands, and/or transmitter architectures.

Certain aspects of the present disclosure provide a DAC circuit. The DAC circuit generally includes a first DAC; a first set of one or more switches coupled between an output of the first DAC and a first output of the DAC circuit; a second DAC; a second set of one or more switches coupled between an output of the second DAC and a second output of the DAC circuit; a third DAC; a third set of one or more switches coupled between an output of the third DAC and a third output of the DAC circuit; a fourth DAC; a fourth set of one or more switches coupled between an output of the fourth DAC and a fourth output of the DAC circuit; a fifth set of one or more switches coupled between the output of the first DAC and a fifth output of the DAC circuit; a sixth set of one or more switches coupled between the output of the second DAC and the fifth output of the DAC circuit; a seventh set of one or more switches coupled between the output of the third DAC and a sixth output of the DAC circuit; and an eighth set of one or more switches coupled between the output of the fourth DAC and the sixth output of the DAC circuit.

Certain aspects of the present disclosure provide a wireless device comprising the DAC circuit described herein. The wireless device generally further includes a first mixer configured to receive a first oscillating signal; and a second mixer configured to receive a second oscillating signal, wherein the second oscillating signal is phase-shifted 90° with respect to the first oscillating signal.

Certain aspects of the present disclosure provide a DAC circuit. The DAC circuit generally includes at least four DACs and a plurality of switches coupled to outputs of the at least four DACs such that the DAC circuit is configured as a multi-channel DAC circuit with at least four channels for a first set of one or more frequency bands and as an interleaved DAC circuit with at least two channels for a second set of one or more frequency bands different from the first set of frequency bands.

Certain aspects of the present disclosure provide a method for wireless communication. The method generally includes configuring a DAC circuit in a first configuration configured to support at least four channels, converting a plurality of first digital signals to a plurality of first analog signals using the DAC circuit in the first configuration, configuring the DAC circuit in a second configuration configured to support at least one channel, but less than four channels, and converting a plurality of second digital signals to one or more second analog signals using the DAC circuit in the second configuration.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
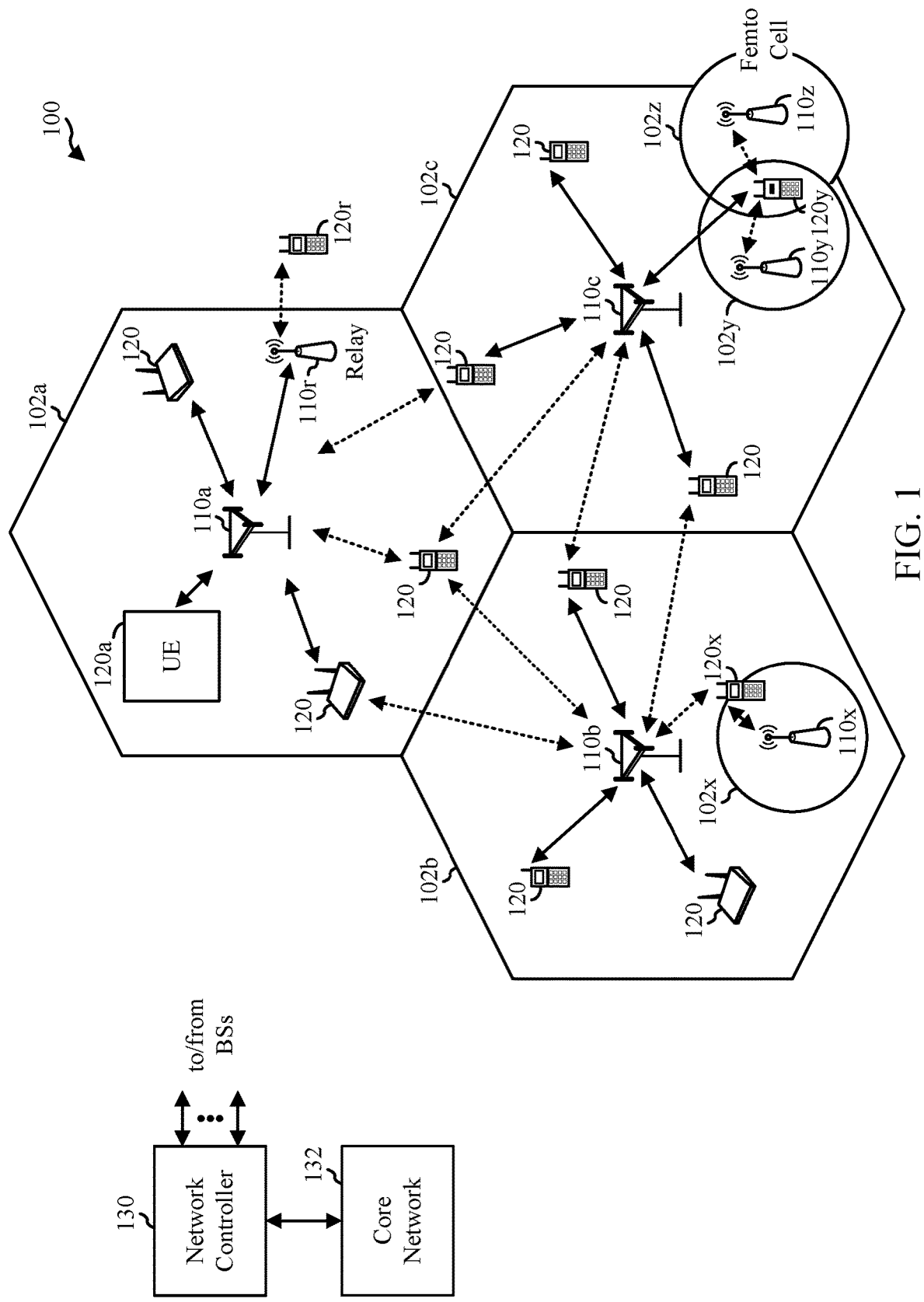
FIG. 1 is a diagram of an example wireless communications network, in which aspects of the present disclosure may be practiced.

Certain aspects of the present disclosure relate to techniques and apparatus for sharing digital-to-analog (DAC) converters in a reconfigurable DAC circuit to support two or more transmit (TX) chains of a radio frequency (RF) transceiver or transmitter. Also referred to as a "converged DAC circuit," the reconfigurable DAC circuit may be able to support different radio access technologies (RATs) (using different sets of frequency bands) and/or different transmitter architectures. Using a single reconfigurable DAC circuit instead of multiple DAC circuits reduces redundancies, saves area and costs in integrated circuits (ICs), and may decrease power consumption.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

As used herein, a "transmit processor," "baseband processor," or "transmit front-end (TXFE) processor" generally relates to logic, such as phase control logic and delay control logic, for processing a digital signal received from a modulator-demodulator (modem) before the digital signal is converted by a DAC to an analog signal for upconversion, filtering, amplification, and transmission. A baseband processor may also be referred to as a "digital baseband transmit processor."

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as a "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to Nan, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a transmitter circuit with a reconfigurable digital-to-analog converter (DAC) circuit capable of supporting multiple radio access technologies (RATs), sets of frequency bands, and/or transmitter architectures and outputting analog signals to two or more transmit chains, as described in detail herein.

Figure 2:
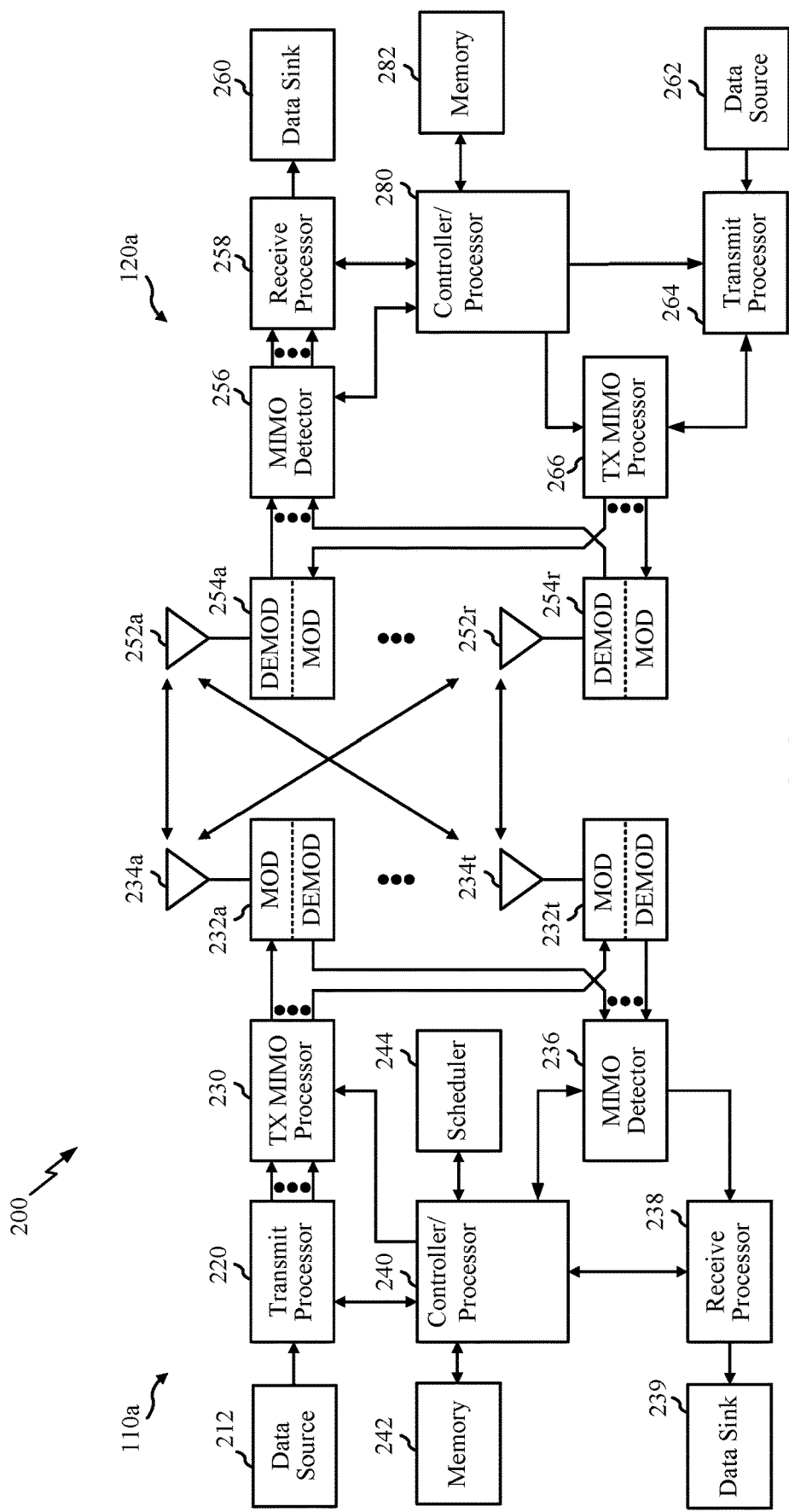
FIG. 2 is a block diagram conceptually illustrating a design of an example base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include a transmitter circuit with a reconfigurable digital-to-analog converter (DAC) circuit capable of supporting different radio access technologies (RATs), different sets of one or more frequency bands, and/or different transmitter architectures and outputting analog signals to two or more transmit chains, as described in detail herein.

Example RF Transceiver

Figure 3:
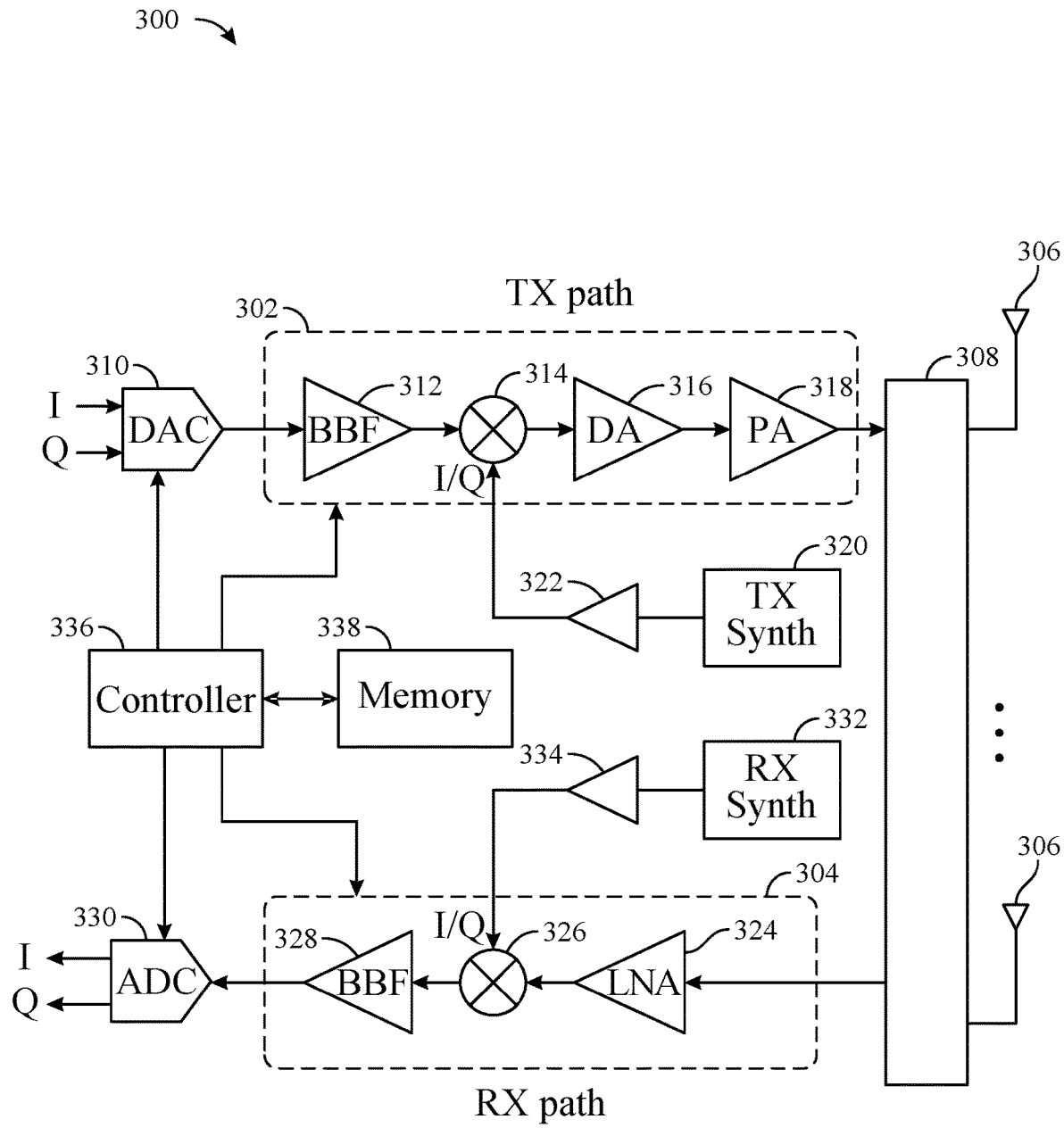
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320. The transmit LO may be buffered or amplified by amplifier 322 before being mixed with the baseband signals in the mixer 314. Similarly, the receive LO may be produced by an RX frequency synthesizer 332. The receive LO may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

Example Multiple Separate Transmit DAC Circuits

In a transmitter that supports different radio access technologies (RATs), each RAT may be supported by at least one transmit chain (e.g., TX path 302), which may comprise one complete set of dedicated circuit elements, such as a transmit processor, a DAC 310, a BBF 312, a mixer 314, a DA 316, and a PA 318. Each transmit chain may include such a separate set of dedicated elements, for example, due to the different frequency, noise, power, and/or distortion specifications of each RAT. For example, a single wireless device supporting cellular vehicle-to-everything (C-V2X), 5G sub-6 GHz (or Frequency Range 1 (FR1)), and 5G millimeter wave (or Frequency Range 2 (FR2)) communications may include TX chains that each include an individual set of dedicated circuit elements, such as those listed above.

Figure 4A:
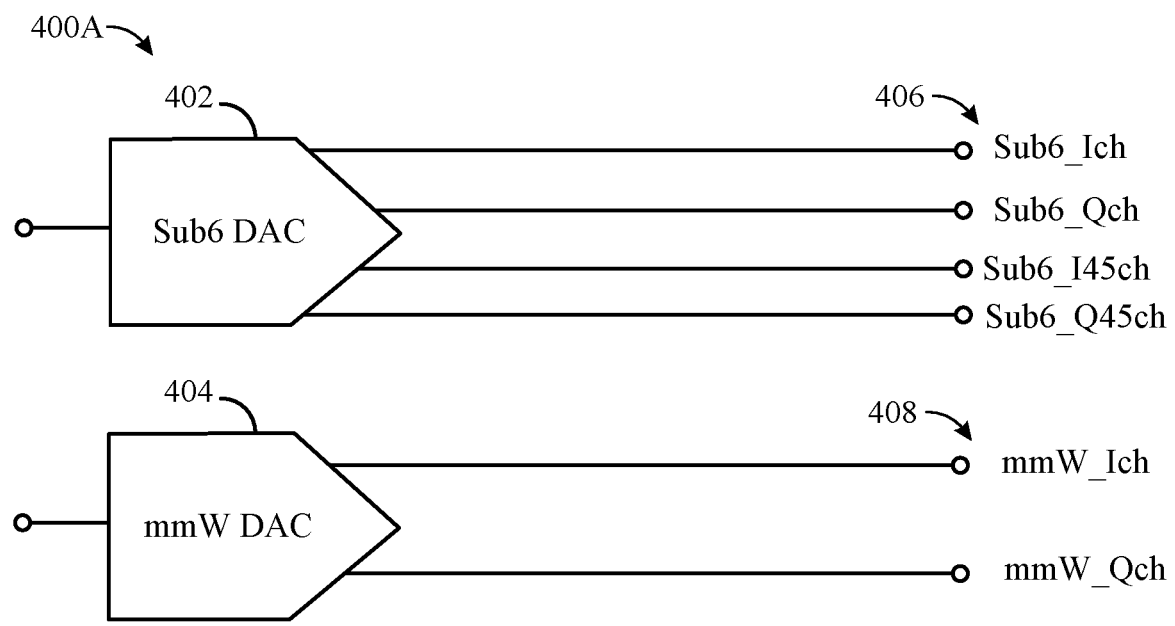
FIG. 4A is a block diagram of a digital-to-analog converter (DAC) architecture that uses different DAC circuits for different sets of frequency bands.

FIG. 4A is a block diagram of a digital-to-analog converter (DAC) architecture 400A that uses different DAC circuits 402, 404 for different sets of frequency bands (or different radio access technologies (RATs)). As illustrated in FIG. 4A, the DAC architecture 400A is configured to support two different sets of frequency bands: sub-6 GHz and mmW. Thus, the DAC architecture 400A may include two DAC circuits: a sub-6 GHz DAC circuit 402 and a mmW DAC circuit 404.

In some cases, a harmonic rejection mixer (HRM) scheme may be used for some frequency bands (e.g., sub-6 GHz frequency bands, but may additionally or alternatively be used for mmW frequency bands). The HRM scheme may involve generating four phase-shifted outputs in the transmitter. Therefore the sub-6 GHz outputs 406 from the DAC circuit 402 may include a sub-6 GHz in-phase channel (sub6_Ich), a sub-6 GHz quadrature channel (sub6_Qch) phase-shifted 90° with respect to the in-phase channel, a sub-6 GHz 45° phase-shifted channel (sub6_I45ch), and a sub-6 GHz 135° phase-shifted channel (sub6_Q45ch). Each of the sub-6 GHz outputs 406 may be inputs to a corresponding transmit chain (e.g., TX path 302). In other aspects, the sub-6 GHz mode may only use two outputs (e.g., sub6_Ich and sub6_Qch) when the HRM scheme is not used.

Two phase-shifted outputs may be generated by the transmitter in mmW mode. The mmW outputs 408 from the DAC circuit 404 may include a mmW in-phase channel (mmW_Ich) and a mmW quadrature channel (mmW_Qch). Each of the mmW outputs 408 may be inputs to a corresponding transmit chain.

Even though a transceiver may include multiple TX chains, for certain aspects, a limited number of TX chains may be simultaneously used. Furthermore, certain RATs may be prevented from transmitting simultaneously from a single device. For example, sub-6 GHz (or C-V2X) and mmW transmit chains may not be enabled concurrently. For example, if the sub-6 GHz DAC circuit 402 is being used, the mmW DAC circuit 404 may be idle (or vice versa). Even when one DAC circuit is idle, however, this idle circuit may still consume power. Therefore, providing a separate DAC circuit for each and every TX chain may be considered redundant, wastes chip area, consumes power unnecessarily, and is not cost-efficient.

Example Reconfigurable Transmit DAC Circuit

Certain aspects of the present disclosure provide a reconfigurable transmit DAC circuit (also referred to as a "converged DAC circuit") that can support multiple RATs (and/or multiple different sets of one or more frequency bands) to reduce redundancies, save integrated circuit (IC) area and cost, and to potentially decrease power consumption. The reconfigurable DAC circuit comprises a shared set of DACs having outputs coupled to a plurality switches that can route the DAC outputs to different transmit chains supporting different RATs (and/or different frequency bands). Additionally or alternatively, for certain aspects, the reconfigurable DAC circuit is reconfigurable to support different transmitter architectures, such as zero-intermediate-frequency (IF), complex-IF, and real-IF architectures, as well as being reconfigurable to support single-layer and dual-layer transmitter architectures, with or without interleaving, allowing for a more versatile transmitter. Such a reconfigurable DAC circuit may support a wide range of full-scale current (IFS) scalability, may be capable of driving different baseband filter and/or different mixer interfaces, and may operate with different sampling rate and clock phase specifications.

Figure 4B:
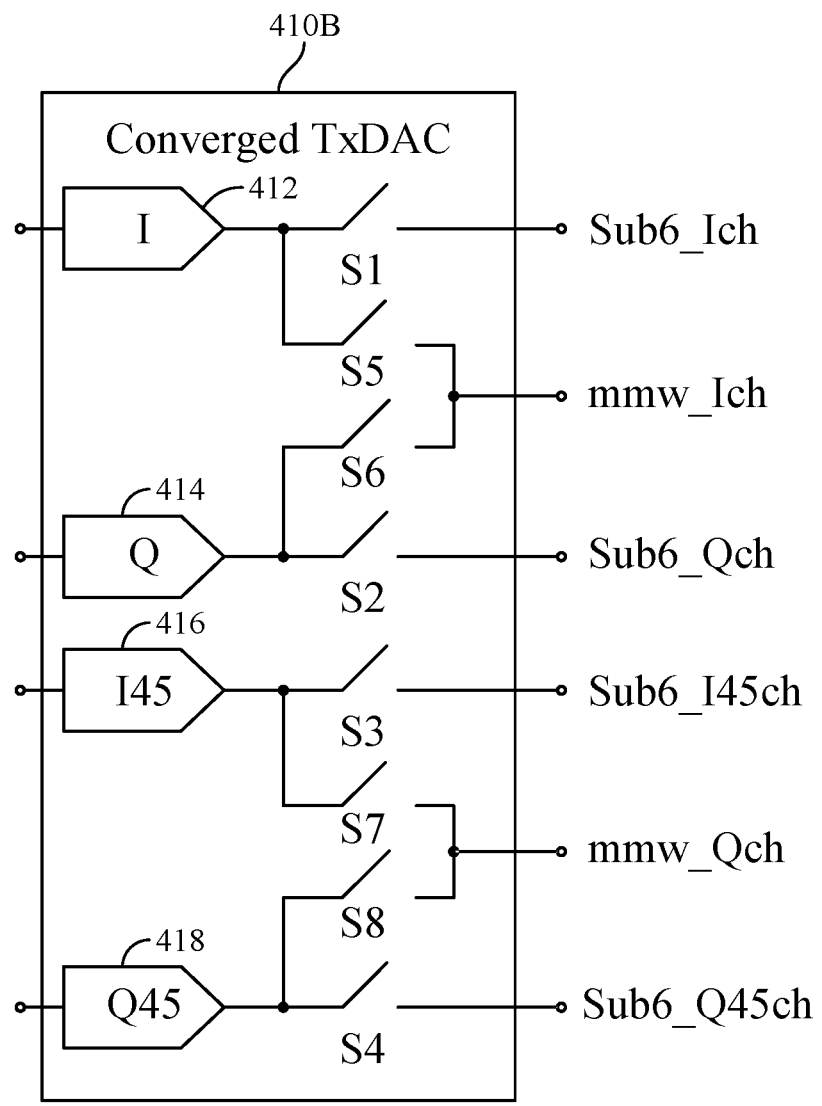
FIG. 4B is a block diagram of an example reconfigurable DAC architecture that uses a single DAC circuit to support different sets of frequency bands, in accordance with certain aspects of the present disclosure.

FIG. 4B is a block diagram of an example DAC architecture that uses a reconfigurable DAC circuit 410B (labeled as a "converged DAC circuit"), in accordance with certain aspects of the present disclosure. The reconfigurable DAC circuit 410B may support different RATs and/or different sets of frequency bands, such as sub-6 GHz (in 5G or C-V2X) and mmW frequency bands. Although sub-6 GHz and mmW frequency bands are used throughout this disclosure, it is to be understood that these terms may be interchangeable with Frequency Range 1 (FR1) and Frequency Range 2 (FR2) frequency bands, respectively, unless otherwise indicated, explicitly or implicitly (e.g., by context).

To support a harmonic rejection mixer (HRM) architecture for sub-6 GHz, the reconfigurable DAC circuit 410B may include four DACs 412, 414, 416, and 418 (which may also be referred to as "subDACs" or "DAC cores"). Although four DACs are shown in FIG. 4B, the reader is to understand that the reconfigurable DAC circuit is not so limited and may include any suitable number of DACs. In certain aspects, DAC 412 (labeled "I") is designated as an in-phase (I) DAC, indicating that DAC 412 is configured to support an I channel in the HRM architecture. Likewise, DAC 414 (labeled "Q") may be designated as a quadrature (Q) DAC, indicating that DAC 414 is configured to support a Q channel in the HRM architecture. Continuing along, DAC 416 (labeled "I45") may be designated as a 45° phase-shifted (I45) DAC, indicating that DAC 416 is configured to support an I45 channel in the HRM architecture, and DAC 418 (labeled "Q45") may be designated as a 135° phase-shifted quadrature (Q45) DAC, indicating that DAC 418 is configured to support a Q45 channel in the HRM architecture.

For certain aspects, DAC 412 may be physically located adjacent to DAC 414 (e.g., for increasing residual sideband (RSB) rejection in particular DAC circuit configurations). Additionally or alternatively, DAC 416 may be physically located adjacent to DAC 418. For other aspects, DAC 412 may be physically located adjacent to DAC 416, and/or DAC 414 may be physically located adjacent to DAC 418.

The reconfigurable DAC circuit 410B may have at least six outputs, including four sub-6 GHz outputs 406 and two mmW outputs 408, as shown in FIG. 4B. To support reconfiguration, the DAC circuit 410B may include a set of one or more switches coupled between each output of the DACs 412, 414, 416, 418 and an output of the DAC circuit 410B. In other words, each output of the DACs 412, 414, 416, 418 may be selectively coupled by multiple sets of switches to different outputs of the DAC circuit 410B. The sets of switches are used to route the outputs of the DACs 412, 414, 416, 418 to one or more transmit chains supporting the RAT (or frequency bands) currently selected for a transmitter comprising the reconfigurable DAC circuit 410B. Each switch may be implemented by a transistor, a transmission gate, or any other suitable component for performing the function of a switch. A controller (e.g., controller 336 in FIG. 3) may control the states (open or closed) of the switches in the reconfigurable DAC circuit 410B.

In the example shown in FIG. 4B, a first set of switches S1 may be coupled between the output of DAC 412 and the sub6_Ich output of the DAC circuit 410B, a second set of switches S2 may be coupled between the output of DAC 414 and the sub6_Qch output of the DAC circuit 410B, a third set of switches S3 may be coupled between the output of DAC 416 and the sub6_I45ch output of the DAC circuit 410B, and a fourth set of switches S4 may be coupled between the output of DAC 418 and the sub6_Q45ch output of the DAC circuit 410B. The sets of switches S1-S4 may be closed to support a sub-6 GHz mode (using an HRM scheme with four channels).

To support DAC convergence and reconfigurability, the DAC circuit 410B also includes a fifth set of switches S5 coupled between the output of DAC 412 and the mmW_Ich output of the DAC circuit 410B. For certain aspects, the DAC circuit 410B also includes a sixth set of switches S6 coupled between the output of DAC 414 and the mmW_Ich output of the DAC circuit 410B. That is, the mmW_Ich output of the DAC circuit 410B may be shorted or otherwise coupled to both the fifth and sixth sets of switches S5, S6, as illustrated in FIG. 4B. Furthermore, the DAC circuit 410B may include a seventh set of switches S7 coupled between the output of DAC 416 and the mmW_Qch output of the DAC circuit 410B. For certain aspects, the DAC circuit 410B also includes an eighth set of switches S8 coupled between the output of DAC 418 and the mmW_Qch output of the DAC circuit 410B. In other words, the mmW_Qch output of the DAC circuit 410B may be shorted or otherwise coupled to both the seventh and eighth sets of switches S7, S8, as illustrated in FIG. 4B.

For certain aspects, any two sets of the fifth through eighth sets of switches S5-S8 may be closed to support a mmW mode (with two channels). For other aspects, any two sets of the fifth through eighth sets of switches (e.g., the fifth and seventh sets S5, S7) may be closed during a first interval, whereas a different two sets of the fifth through eighth sets of switches S5-S8 (e.g., the sixth and eights sets of switches S6, S8) may be closed during a second interval, subsequent to the first interval, in an alternating fashion to support a mmW mode with interleaving (e.g., for a faster DAC circuit sampling rate).

As described above, the sets of switches may be used to route the outputs of DACs 412, 414, 416, 418 to the selected transmit chains. For example, when the DAC circuit 410B is configured to support a sub-6 GHz mode (and the associated frequency bands), the first through fourth sets of switches S1-S4 coupled between the outputs of DACs 412, 414, 416, 418 and the sub-6 GHz outputs 406 are closed, while the fifth through eighth sets of switches S5-S8 coupled to the mmW outputs 408 are open. This routes the outputs of DACs 412, 414, 416, 418 to the four outputs used by the sub-6 GHz mode (for an HRM scheme).

Because the mmW mode may not utilize an HRM scheme, the mmW mode may only use two outputs (one for in-phase and one for quadrature) of the DAC circuit 410B. However, because the reconfigurable DAC circuit 410B includes four DACs in the example of FIG. 4B, signals from pairs of outputs of the four DACs 412, 414, 416, 418 may be interleaved. When the DAC circuit 410 is configured to support a mmW mode (and the associated frequency bands), the first through fourth sets of switches S1-S4 may remain open, and one set of the two sets of switches coupled to each of the mmW outputs 408 may be closed, while the other set (of switches in this pair may be open, to route the outputs of two of the DACs 412, 414, 416, 418 to the mmW transmission chains, during a first interval. Then, during a second interval, the previously closed sets of switches coupled to each of the mmW outputs 408 may be opened, and the previously open sets of switches coupled to each of the mmW outputs 408 may be closed. The first and second intervals may repeat in an alternating fashion, thereby interleaving the outputs of the DACs 412, 414, 416, 418. For example, sets of switches S5 and S7 may be closed, and sets of switches S6 and S8 may be open, during a first interval, thereby routing the output of DAC 412 to the mmW_Ich output and routing the output of DAC 416 to the mmW_Qch output. Then, during a second interval, sets of switches S5 and S7 may be opened, and sets of switches S6 and S8 may be closed, thereby routing the output of DAC 414 to the mmW_Ich output and routing the output of DAC 418 to the mmW_Qch output. In this manner, the reconfigurable DAC circuit 410B may be configured as an interleaved DAC circuit with two channels (mmW_Ich and mmW_Qch).

Alternatively, in certain aspects the reconfigurable DAC circuit 410B may not be configured for interleaving in the mmW mode. In this case, the sets of switches S1-S4 may be open, two sets (e.g., sets S5 and S7) out of the sets of switches S5-S8 may be closed, and the other two sets (e.g., sets S6 and S8) out of the sets of switches S5-S8 may be open for the mmW mode.

Figure 5A:
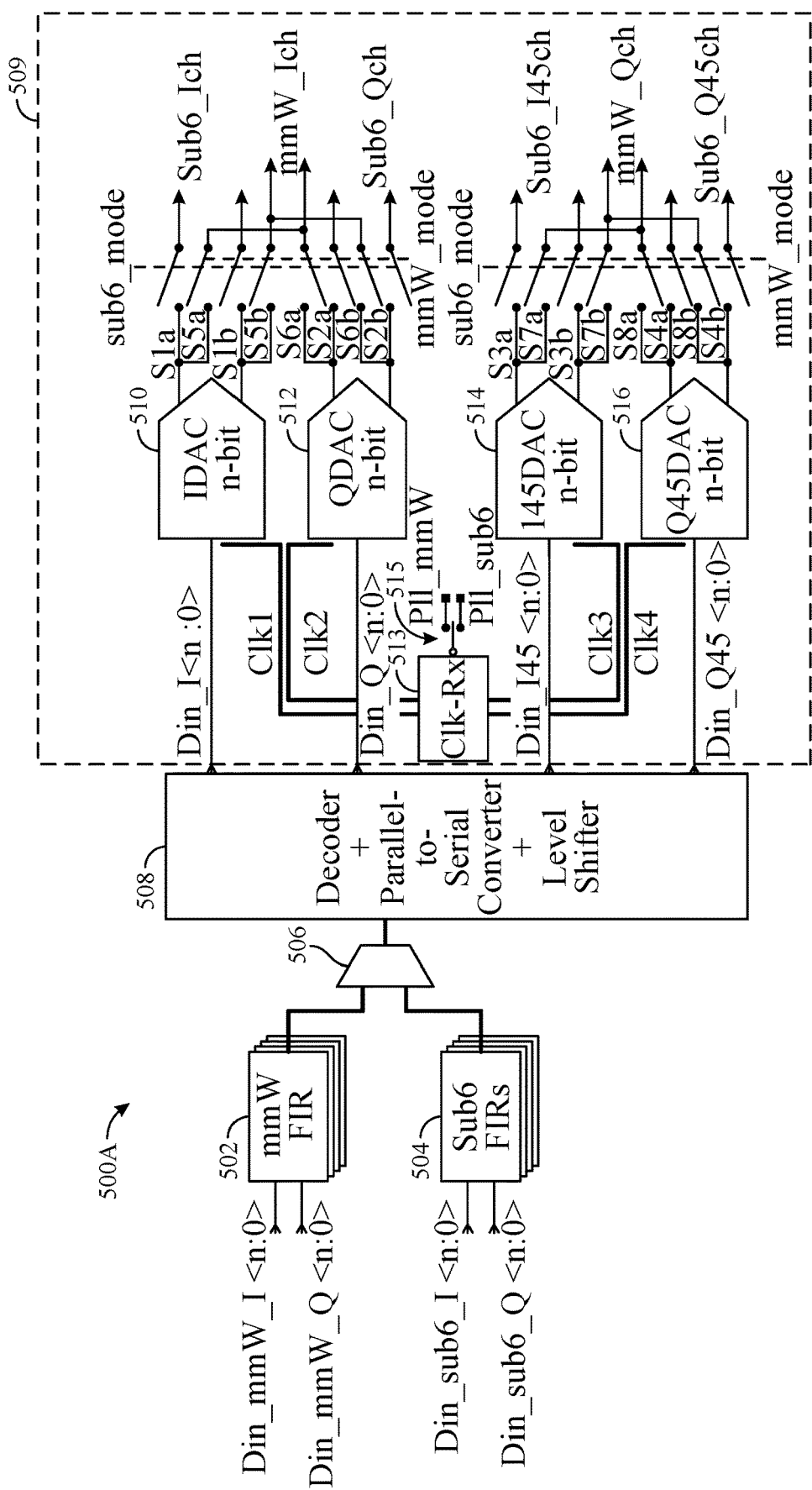
FIG. 5A is a block diagram of a portion of an example wireless transmitter circuit with a reconfigurable DAC circuit to support different sets of frequency bands, in accordance with certain aspects of the present disclosure.

Although the DACs 412, 414, 416, 418 are illustrated as having single-ended outputs coupled to single-ended outputs of the DAC circuit 410B in FIG. 4B, each DAC may have a differential output selectively coupled by switches to differential outputs of the DAC circuit (e.g., as illustrated in FIG. 5A).

FIG. 5A is a block diagram of a portion of an example wireless transmitter circuit 500A, in accordance with certain aspects of the present disclosure. The wireless transmitter circuit 500A may include a mmW finite impulse response (FIR) filter 502, a sub-6 GHz FIR filter 504, a multiplexer (MUX) 506, processing circuitry 508, and a reconfigurable DAC circuit 509 configured to support different sets of frequency bands. The reconfigurable DAC circuit 509 may include DACs 510, 512, 514, 516, a clock distribution circuit 513 (labeled "Clk-Rx"), and a MUX 515. The DACs 510, 512, 514, 516 may have a scalable full-scale current (IFS), for certain aspects.

The mmW FIR filter 502, the sub-6 GHz FIR filter 504, the MUX 506, and at least a portion of the processing circuitry 508 may be part of a processor, such as a baseband processor. The mmW FIR filter 502 may receive and filter n-bit digital in-phase and quadrature mmW inputs (labeled "Din_mmW_I" and "Din_mmW_Q," respectively), which may be received from a modem or another portion of the processor, for example. Likewise, the sub-6 GHz FIR filter 504 may receive and filter n-bit digital in-phase and quadrature sub-6 GHz inputs (labeled "Din_mmW_I" and "Din_mmW_Q," respectively), which may also be received from the modem or another portion of the processor, for example. The MUX 506 may be used to select between the outputs of the mmW FIR filter 502 and the sub-6 GHz FIR filter 504 for routing to the processing circuitry 508. The processing circuitry 508 may include at least one of a decoder, a parallel-to-serial converter, and a level shifter, for example. The n-bit digital outputs of the processing circuitry 508 (labeled "Din_I," "Din_Q," "Din_I45," and "Din_Q45") may be routed to corresponding DACs in the reconfigurable DAC circuit 509.

The reconfigurable DAC circuit 509 may be similar to the reconfigurable DAC circuit 410B in FIG. 4B, and the DACs 510, 512, 514, 516 may be similar to the DACs 412, 414, 416, 418, respectively, except that the reconfigurable DAC circuit 509 has differential outputs, the DACs 510, 512, 514, 516 have differential outputs, and each set of switches S1-S8 includes a pair of switches (indicated by an "a" and a "b" designation). For example, the first set of switches S1 includes switch S1a and switch S1b, which are coupled between the differential outputs of DAC 510 and the sub6_Ich differential outputs. Similarly, the second set of switches S2 includes switch S2a and switch S2b coupled between the differential outputs of DAC 512 and the sub6_Qch differential outputs, the third set of switches S3 includes switch S3a and switch S3b coupled between the differential outputs of DAC 514 and the sub6 I45ch differential outputs, and the fourth set of switches S4 includes switch S4a and switch S4b coupled between the differential outputs of DAC 516 and the sub6_Q45ch differential outputs. To support the mmW frequency bands in the reconfigurable DAC circuit, the fifth set of switches S5 includes switch S5a and switch S5b coupled between the differential outputs of DAC 510 and the mmW_Ich differential outputs, the sixth set of switches S6 includes switch S6a and switch S6b coupled between the differential outputs of DAC 512 and the mmW_Ich differential outputs, the seventh set of switches S7 includes switch S7a and switch S7b coupled between the differential outputs of DAC 514 and the mmW_Qch differential outputs, and the eighth set of switches S8 includes switch S8a and switch S8b coupled between the differential outputs of DAC 516 and the mmW_Qch differential outputs.

The MUX 515 may receive clock signals from multiple sources (e.g., multiple frequency synthesizers, such as the TX frequency synthesizer 320 in FIG. 3) and select one of the received clock signals for outputting to the clock distribution circuit 513. This selection may be controlled by a control signal (e.g., from the controller 336) received by a control input of the MUX 515. For certain aspects, as illustrated in FIG. 5A, the MUX 515 may be implemented as a single-pole, double-throw (SPDT) switch. In the example of FIG. 5A, the MUX 515 may receive a clock signal (labeled "Pll_sub6") corresponding to the sub-6 GHz frequency bands and a clock signal (labeled "Pll_mmW") corresponding to the mmW frequency bands.

The clock distribution circuit 513 may output multiple clock lines for routing to the different DACs in the reconfigurable DAC circuit 509. For certain aspects, the clock distribution circuit 513 may output a different clock line to each one of the DACs. For example, as shown in FIG. 5A, the clock distribution circuit 513 may output four clock lines Clk1-Clk4, one for each of the four DACs in the reconfigurable DAC circuit 509. In this case, clock line Clk1 may be coupled between a first output of the clock distribution circuit 513 and a clock input of DAC 510, clock line Clk2 may be coupled between a second output of the clock distribution circuit 513 and a clock input of DAC 512, clock line Clk3 may be coupled between a third output of the clock distribution circuit 513 and a clock input of DAC 514, and clock line Clk4 may be coupled between a fourth output of the clock distribution circuit 513 and a clock input of DAC 516. By routing a different clock line to each one of the DACs, each clock line may be separately calibrated (e.g., by adjusting a delay for each output of the clock distribution circuit), such that the sample timing of each DAC in the reconfigurable DAC circuit may be separately controlled, despite different physical lengths in (and hence difference delays due to) the clock lines. For other aspects, at least some of the DACs may share at least one clock line from the clock distribution circuit 513, such that there may be less than four clock lines in the case of four DACs.

The sets of switches in the reconfigurable DAC circuit 509 of FIG. 5A may be operated in the same manner as the corresponding sets of switches S1-S8 in the reconfigurable DAC circuit 410B of FIG. 4B. For example, when the sub-6 GHz mode is selected, the Pll_sub6 clock signal may be selected by the MUX 515 and distributed from the clock distribution circuit 513, switches S1a, S1b, S2a, S2b, S3a, S3b, and S4a, and S4b may be closed, and the remaining switches S5a-S8b may be open, thus routing the differential outputs of DACs 510-514 to the respective differential sub-6 GHz outputs of the DAC circuit 509. When the wireless transmitter circuit 500A is in the mmW mode, the operation of the sets of switches S1-S8, with or without interleaving, is described above with respect to FIG. 4B and need not be repeated here.

Figure 6A:
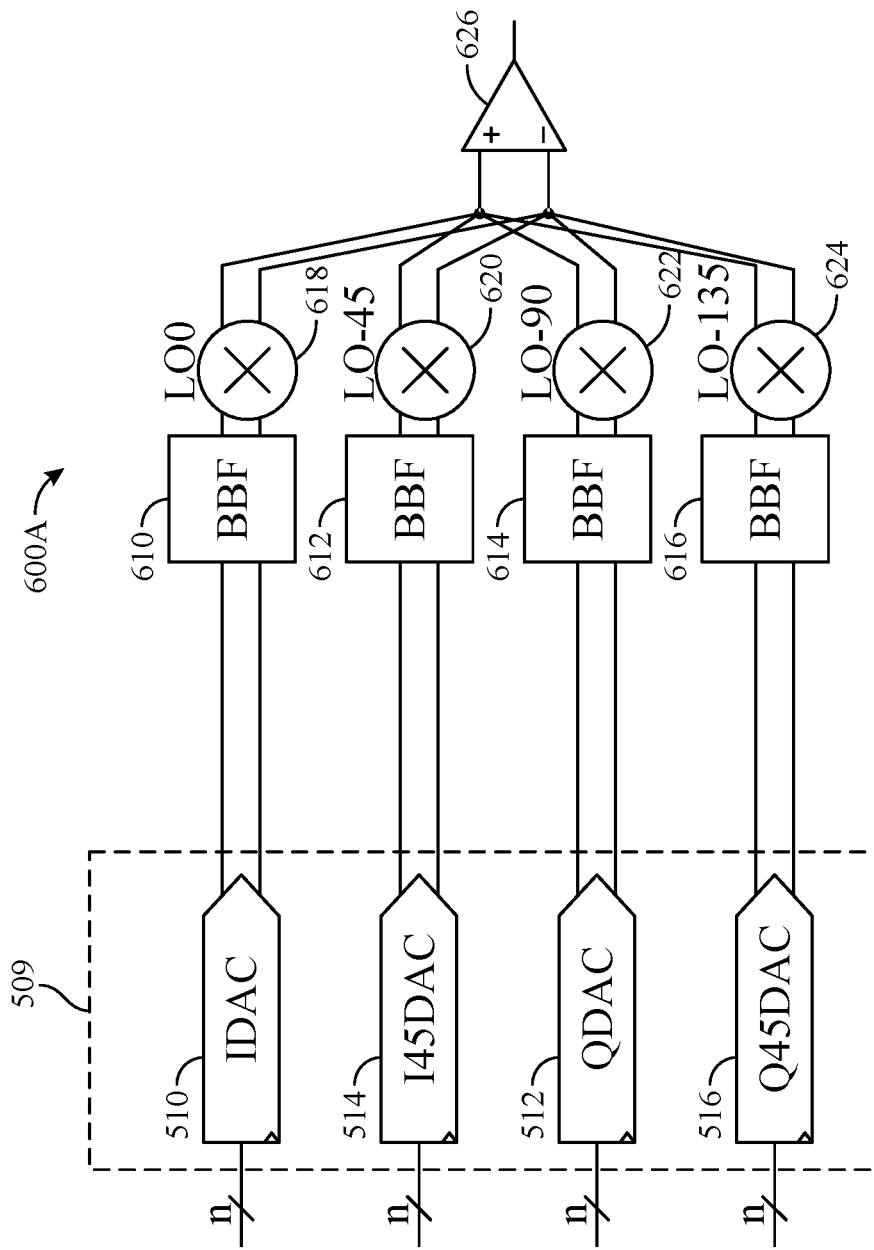
FIG. 6A is a block diagram of a portion of an example transmitter front-end configured to support sub-6 GHz frequency bands and coupled to a reconfigurable DAC circuit, in accordance with certain aspects of the present disclosure.

FIG. 6A is a block diagram of a portion of an example transmitter front-end 600A configured to support the sub-6 GHz frequency bands and coupled to outputs of the reconfigurable DAC circuit 509 selected to operate in the sub-6 GHz mode, in accordance with certain aspects of the present disclosure. Because the transmitter front-end 600A is operating in the sub-6 GHz mode, it is to be understood that the sets of switches S1-S4 in the reconfigurable DAC circuit 509 are closed (but not explicitly shown) to route the outputs of the DACs 510, 512, 514, 516 to the transmit paths for sub-6 GHz transmissions, and the sets of switches S5-S8 are open (but not shown).

The transmitter front-end 600A includes four transmit paths for sub-6 GHz transmissions using the HRM scheme. Each of the four sub-6 GHz differential outputs (Sub6_Ich, Sub6_Qch, Sub6_I45ch, and Sub6_Q45ch) of the DAC circuit 509 may be coupled to a different transmit path. The four transmit paths each include a baseband filter (one of baseband filters 610, 612, 614, 616) and a mixer (one of mixers 618, 620, 622, 624). Each of the baseband filters 610, 612, 614, 616 may be analogous to BBF 312, and each of the mixers 618, 620, 622, 624 may be analogous to mixer 314.

In the example of FIG. 6A, the differential outputs of DAC 510 (and sub6_Ich) are coupled to differential inputs of baseband filter (BBF) 610, and differential outputs of BBF 610 are coupled to differential inputs of mixer 618. Mixer 618 may also receive an in-phase local oscillator signal (labeled "LO0"), which is the reason DAC 510 may be designated as the in-phase DAC (IDAC) in the sub-6 GHz mode. The differential outputs of DAC 512 (and sub6_Qch) are coupled to differential inputs of BBF 614, and differential outputs of BBF 614 are coupled to differential inputs of mixer 622. Mixer 618 may also receive a quadrature local oscillator signal (labeled "LO90"), phase-shifted 90° with respect to the in-phase local oscillator signal, which is the reason DAC 512 may be designated as the quadrature DAC (QDAC) in the sub-6 GHz mode. The differential outputs of DAC 514 (and sub6_I45ch) are coupled to differential inputs of BBF 612, and differential outputs of BBF 612 are coupled to differential inputs of mixer 620. Mixer 620 may also receive a local oscillator signal (labeled "LO45") phase-shifted 45° with respect to the in-phase local oscillator signal, which is the reason DAC 514 may be designated as the I45DAC. The differential outputs of DAC 516 (and sub6_Q45ch) are coupled to differential inputs of BBF 616, and differential outputs of BBF 616 are coupled to differential inputs of mixer 624. Mixer 624 may also receive a local oscillator signal (labeled "LO135") phase-shifted 135° with respect to the in-phase local oscillator signal (and 45° with respect to the quadrature local oscillator signal, which is the reason DAC 516 may be designated as the Q45DAC.

The transmitter front-end 600A also includes an amplifier 626, which may represent a driver amplifier and/or a power amplifier (e.g., DA 316 and/or PA 318 in FIG. 3). The differential outputs from each transmit path (e.g., the outputs of each mixer) may be combined and coupled to inputs of the amplifier 626.

Figure 6B:
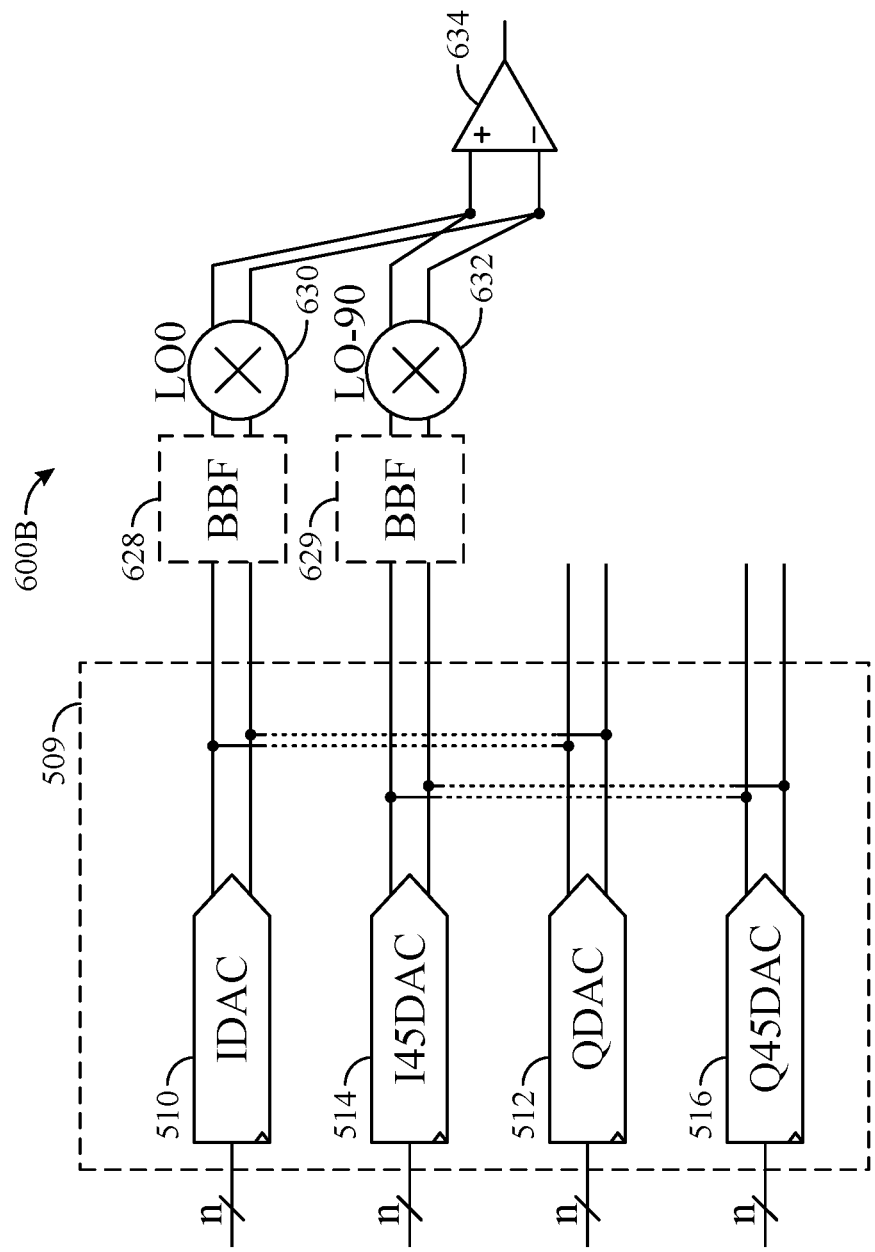
FIG. 6B is a block diagram of a portion of an example transmitter front-end configured to support millimeter wave (mmW) frequency bands and coupled to a reconfigurable DAC circuit, in accordance with certain aspects of the present disclosure.

FIG. 6B is a block diagram of a portion of an example transmitter front-end 600B configured to support the mmW frequency bands and coupled to outputs of the reconfigurable DAC circuit 509 selected to operate in the mmW mode, in accordance with certain aspects of the present disclosure. Because the transmitter front-end 600B is operating in the mmW mode, it is to be understood that the sets of switches S1-S4 in the reconfigurable DAC circuit 509 are open (but not explicitly shown), and that the sets of switches S5-S8 are selectively closed (but not shown) to route the outputs of the DACs 510, 512, 514, 516 to the transmit paths for mmW transmissions, with or without interleaving (as explained above).

As illustrated in FIG. 6B, the transmitter front-end 600B includes two transmit paths for mmW transmissions. Each of the mmW differential outputs (mmW_Ich and mmW_Qch) of the DAC circuit 509 may be coupled to a different transmit path. The two transmit paths each include a mixer (one of mixers 630, 632). Each of the mixers 630, 632 may be analogous to mixer 314. Due to interleaving, the differential outputs of DAC 510 or DAC 512 may be coupled to the mmW_Ich output of the reconfigurable DAC circuit 509. The mmW_Ich output may be coupled to differential inputs of mixer 630. Mixer 630 may also receive an in-phase local oscillator signal (labeled "LO0"), which is the reason this differential output of the DAC circuit 509 is designated as "mmW_Ich." The differential outputs of DAC 514 or DAC 516 (based on interleaving) may be coupled to the mmW_Qch output of the reconfigurable DAC circuit 509. The mmW_Qch output may be coupled to differential inputs of mixer 632. Mixer 632 may also receive a quadrature local oscillator signal (labeled "LO90"), which is the reason this differential output of the DAC circuit 509 is designated as "mmW_Qch."

Each of the transmission chains may include an optional baseband filter (BBF) disposed between the mmW outputs of the DAC circuit 509 and the input of each mixer 630, 632. For example, the differential mmW_Ich outputs may be coupled to differential inputs of BBF 628, and differential outputs of BBF 628 may be coupled to the differential inputs of mixer 630. Likewise, the differential mmW_Qch outputs may be coupled to differential inputs of BBF 629, and differential outputs of BBF 629 may be coupled to the differential inputs of mixer 632. Each of the BBFs 628, 629 may be analogous to BBF 312 in FIG. 3.

The transmitter front-end 600B also includes an amplifier 634, which may represent a driver amplifier and/or a power amplifier (e.g., DA 316 and/or PA 318 in FIG. 3). The differential outputs from each transmit path (e.g., the outputs of each mixer) may be combined and coupled to inputs of the amplifier 634.

Example Reconfigurable Transmit DAC Circuit Supporting More than Two RATs (or Frequency Bands) and/or Multiple Transmitter Architectures It may be desirable to provide a DAC circuit that can be reconfigured to support more or different frequency bands (or RATs) than sub-6 GHZ and mmW frequency bands. Additionally or alternatively, it may be desirable to provide a DAC circuit that can be reconfigured to support different transmitter architectures. For example, the transmitter architecture illustrated in FIG. 3 is a zero-intermediate-frequency (IF) architecture, in which digital baseband signals are converted by a DAC circuit to analog baseband signals, which are upconverted to radio frequency (RF) signals for transmission. Other transmitter architectures (e.g., complex-IF and real-IF architectures) may involve generating digital IF signals from digital baseband signals, converting the digital IF signals to analog IF signals, and upconverting the analog IF signals to RF signals for transmission. Different transmitter architectures have different advantages, which may make a particular architecture more or less suitable for a given scenario. For example, a real-IF architecture may be preferred in certain mmW bands due to advantageous frequencies that enable low crosstalk, reduce power, reduce cable loss, and provide enhanced RSB rejection. In some designs, a real-IF architecture may be preferred at lower bandwidths (e.g., <600 MHz), whereas a quadrature scheme (e.g., a zero-IF or complex-IF architecture) may be preferred at higher bandwidths (e.g., at 1000 MHz).

Certain aspects of the present disclosure provide a reconfigurable DAC circuit that is able to support multiple transmitter architectures and/or more than two RATs (or frequency bands). Sharing a reconfigurable common DAC circuit may reduce redundancies, save chip area, and decrease power consumption.

Figure 4C:
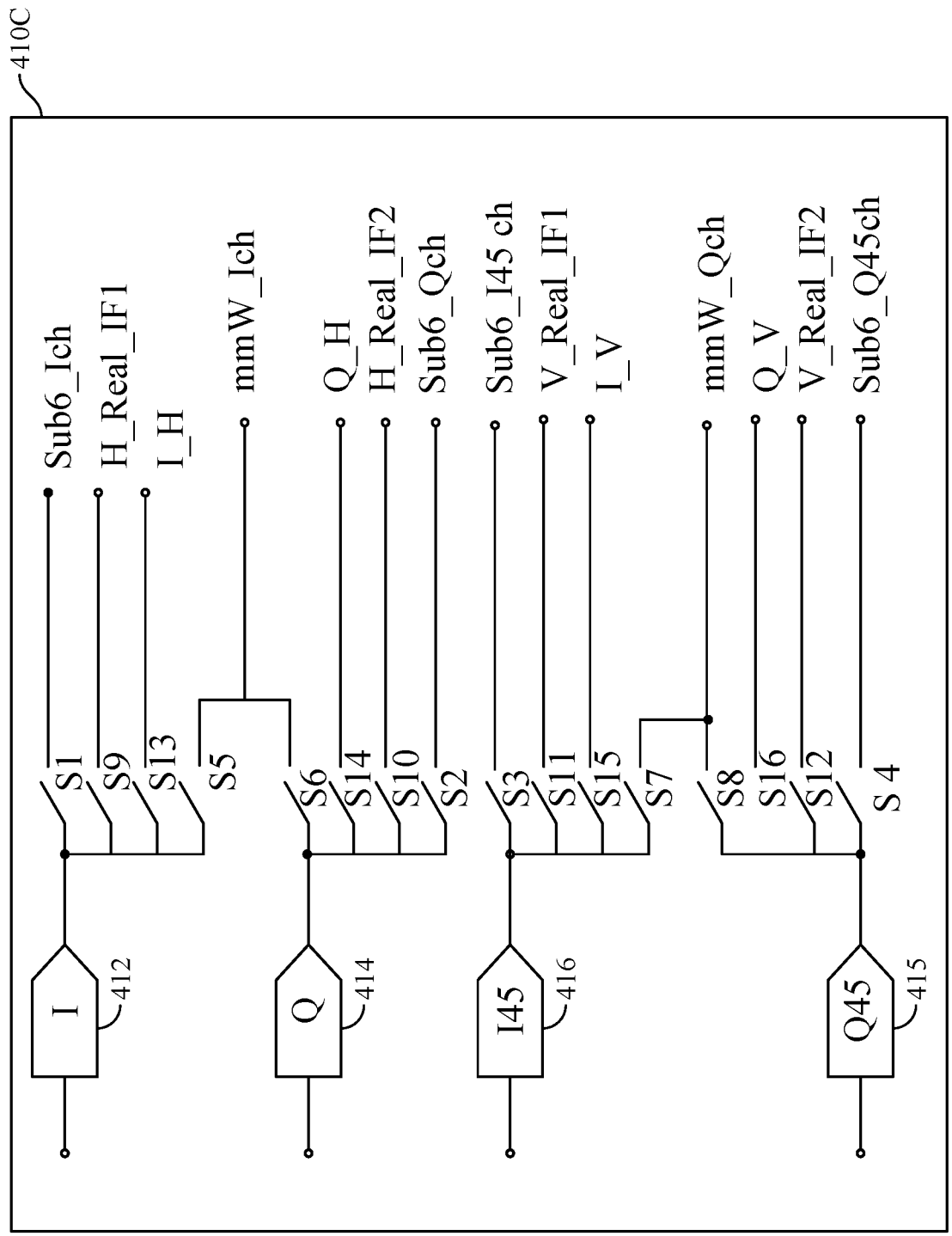
FIG. 4C is a block diagram of an example reconfigurable DAC architecture that uses a single DAC circuit to support different sets of frequency bands and different transmitter architectures, in accordance with certain aspects of the present disclosure.

FIG. 4C is a block diagram of an example reconfigurable DAC circuit 410C configured to support multiple RATs, multiple frequency bands, and/or different transmitter architectures, in accordance with certain aspects of the present disclosure. The reconfigurable DAC circuit 410C may be similar to the reconfigurable DAC circuit 410B, with additional outputs and corresponding sets of switches, for example, for supporting multiple transmitter architectures and/or more than two RATs (or sets of frequency bands). For example, the reconfigurable DAC circuit 410C may be configured to support sub-6 GHz frequency bands, mmW frequency bands, a real-IF architecture, and a dual-layer quadrature scheme (a legacy mmW architecture). For schemes supporting intermediate frequency (IF) signals (e.g., real-IF or complex-IF architectures), the DACs 412, 414, 416, 418 should be capable of handling digital IF signals.

To achieve this, the reconfigurable DAC circuit 410C may include eight additional outputs and eight additional sets of switches. Although 16 total DAC circuit outputs and 16 sets of switches are illustrated in the example of FIG. 4C, the reader is to understand any suitable number of DAC circuit outputs and suitable number of associated sets of switches may be selected. To support a real-IF architecture with the DAC circuit 410C, a ninth set of switches S9 may be coupled between the output of DAC 412 and a real-IF horizontal polarization output (labeled "H_Real_IF1"). A tenth set of switches S10 may be coupled between the output of DAC 414 and another real-IF horizontal polarization output (H_Real_IF2) of the DAC circuit 410C. For certain aspects, the real-IF horizontal polarization outputs H_Real_IF1 and H_Real_IF2 may be shorted or otherwise coupled together and considered as a single output H_Real_IF. An eleventh set of switches S11 may be coupled between the output of DAC 416 and a real-IF vertical polarization output (V_Real_IF1). A twelfth set of switches S12 may be coupled between the output of DAC 418 and another real-IF vertical polarization output (V_Real_IF2) of the DAC circuit. For certain aspects, the real-IF vertical polarization outputs V_Real_IF1 and V_Real_IF2 may be shorted or otherwise coupled together and considered as a single output V_Real_IF. To support a dual-layer quadrature scheme with the DAC circuit 410C, a thirteenth set of switches S13 may be coupled between the output of DAC 412 and an in-phase horizontal polarization output (I_H), a fourteenth set of switches S14 may be coupled between the output of DAC 414 and a quadrature horizontal polarization output (Q_H), a fifteenth set of switches S15 may be coupled between the output of DAC 416 and an in-phase vertical polarization output (I_V), and a set of switches including switch S16 may be coupled between the output of DAC 418 and a quadrature vertical polarization output (Q_V). The sets of switches S1-S16 may be used to route the outputs of DACs 412, 414, 416, 418 to the selected transmit chains based on the desired RAT, set of frequency bands, or transmit architecture.

When the dual-layer quadrature (legacy mmW) mode is selected, the sets of switches are controlled to couple the DACs 412, 414, 416, 418 to the in-phase horizontal (I_H), quadrature horizontal (Q_H), in-phase vertical (I_V), and quadrature vertical (Q_V) polarization outputs. In the reconfigurable DAC circuit 410C, the twelfth through sixteenth sets of switches S13-S16 are closed, and the other sets of switches S1-S12 are open (see, e.g., FIG. 6C). This routes the output of DAC 412 to the I_H output, the output of DAC 414 to the Q_H output, the output of DAC 416 to the I_V output, and the output of DAC 418 to the Q_V output. In this configuration, DAC 412 is designated as an in-phase horizontal polarization (I_H) DAC, DAC 414 is designated as a quadrature horizontal polarization (Q_H) DAC, DAC 416 is designated as an in-phase vertical polarization (I_V) DAC, and DAC 418 is designated as a quadrature vertical polarization (Q_V) DAC.

When the real-IF architecture is selected, the DAC circuit 410C may be configured to support different real-IF modes, such as dual-layer real-IF or single-layer real-IF, with or without interleaving.

When the dual-layer real-IF mode with interleaving is selected, two pairs of related sets of switches (e.g., the horizontal pair and the vertical pair) in the ninth through twelfth sets of switches S9-S12 may be closed, with each member of the pair being closed in an alternating fashion and with the remaining sets of switches (sets S1-S8 and S13-S16) being open. In this alternating manner, the designated horizontal pair of switches (sets S9 and S10) intermittently couple the output of DAC 412 or the output of DAC 414 to the real-IF horizontal polarization output (H_Real_IF), and the designated vertical pair of switches (sets S11 and S12) intermittently couple the output of DAC 416 or the output of DAC 418 to the real-IF vertical polarization output (V_Real_IF), to accomplish interleaving.

When the single-layer real-IF mode with interleaving is selected, only a real-IF horizontal polarization signal (or only a real-IF vertical polarization signal) may be output by the reconfigurable DAC circuit 410C. Thus, two related sets of switches (e.g., either the horizontal or the vertical switches) out of the ninth through twelfth sets of switches S9-S12 may be closed (e.g., sets S9 and S10) in an alternating fashion, and the other two sets (e.g., sets S11 and S12) may be open (see, e.g., FIG. 6E), with the remaining sets of switches (sets S1-S8 and S13-S16) being open in the DAC circuit 410C. In this alternating manner, the two sets of switches coupled to the real-IF horizontal polarization outputs (or to the real-IF vertical polarization outputs) are interleaved. For example, sets of switches S9 and S10 coupled to outputs H_Real_IF1 and H_Real_IF2, respectively, (which may be shorted or otherwise coupled together to form a single H_Real_IF output) may be interleaved, while sets of switches S11 and S12 are constantly open in this mode. Alternatively, sets of switches S11 and S12 coupled to outputs V_Real_IF1 and V_Real_IF2, respectively, may be interleaved, while sets of switches S9 and S10 are constantly open.

When the dual-layer real-IF mode without interleaving is selected, two sets of switches out of the ninth through twelfth sets of switches S9-S12 may be closed (e.g., sets S9 and S11), and the other two sets (e.g., sets S10 and S12) may be open (see, e.g., FIG. 6F), with the remaining sets of switches (sets S1-S8 and S13-S16) being open in the DAC circuit 410C. This routes the output of DAC 412 to the H_Real_IF1 output (or the output of DAC 414 to the H_Real_IF2 output), as the horizontal real-IF output. This also routes the output of DAC 416 to the V_Real_IF1 output (or the output of DAC 418 to the V_Real_IF2 output), as the vertical real-IF output.

Figure 5B:
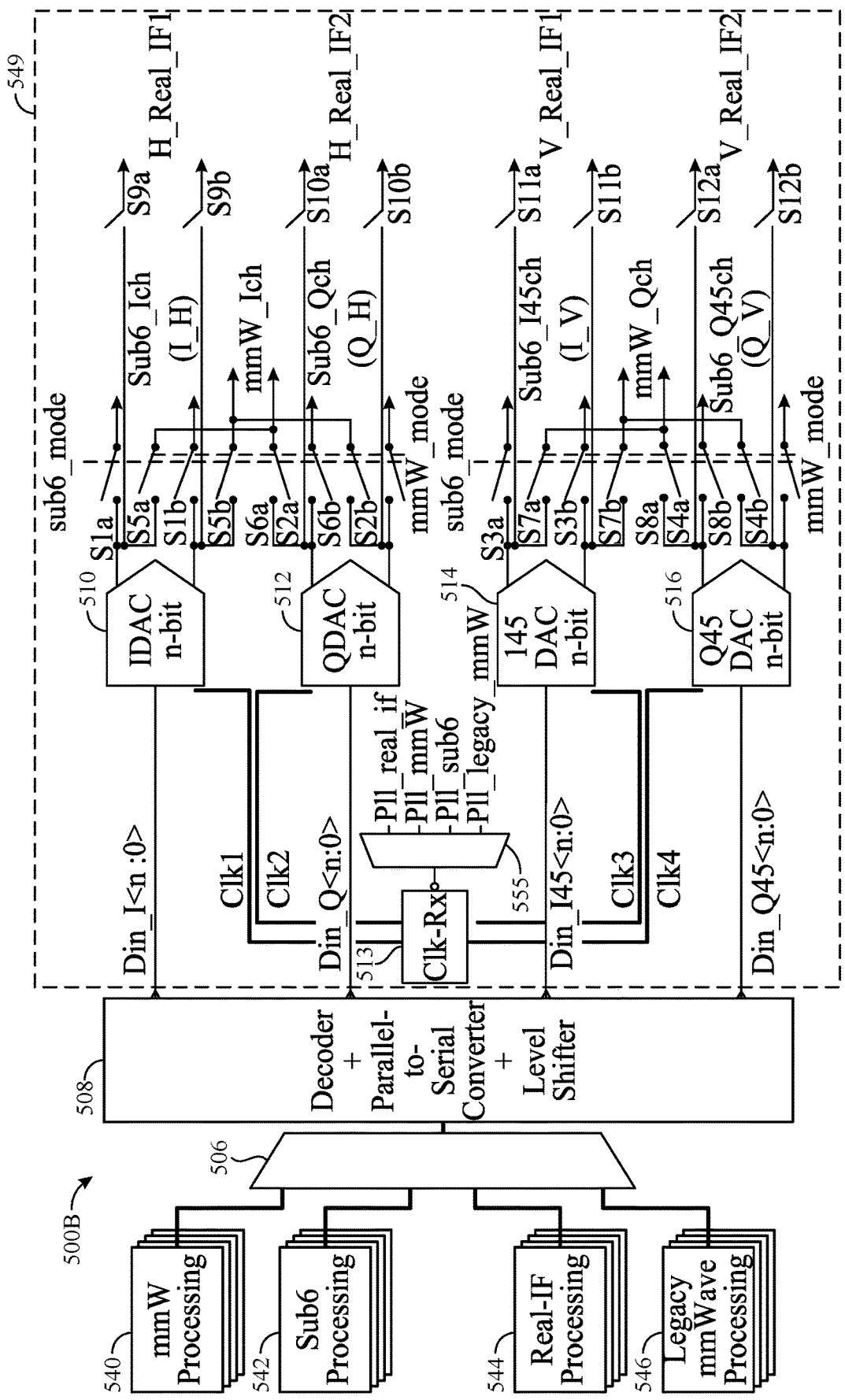
FIG. 5B is a block diagram of a portion of an example wireless transmitter circuit with a reconfigurable DAC circuit to support different sets of frequency bands and different transmitter architectures, in accordance with certain aspects of the present disclosure.

FIG. 5B is a block diagram of a portion of an example wireless transmitter circuit 500B, in accordance with certain aspects of the present disclosure. The wireless transmitter circuit 500B may include mmW processing circuitry 540, sub-6 GHz processing circuitry 542, real-IF processing circuitry 544, legacy mmW processing circuitry 546 (for the dual-layer quadrature scheme), MUX 506, processing circuitry 508, and a reconfigurable DAC circuit 549 configured to support different RATs, different sets of frequency bands, and/or different transmitter architectures. The reconfigurable DAC circuit 549 may include the clock distribution circuit 513, DACs 510, 512, 514, 516, and a MUX 555.

The mmW processing circuitry 540, sub-6 GHz processing circuitry 542, real-IF processing circuitry 544, and legacy mmW processing circuitry 546 may each be configured to process digital inputs, and a control bit of the MUX 506 may be used to select between the processed digital signals. The processed digital signals may be digital baseband signals (e.g., in the case of zero-IF transmitter architectures) or may be digital intermediate frequency (IF) signals (e.g., in the case of complex-IF or real-IF architectures). Although these particular four processing circuits are shown in the example of FIG. 5B, the reader is to understand that the transmitter circuit 500B may include any suitable number of processing circuits, which may process digital signals for different RATs, different sets of frequency bands, and/or different transmitter architectures than the example processing circuits shown.

The reconfigurable DAC circuit 549 may be similar to the reconfigurable DAC circuit 509 in FIG. 5A, but with additional sets of switches S9-S12 to support the real-IF architecture. The sets of switches S1-S12 are similar to the sets of switches S1-S12 in the reconfigurable DAC circuit 410C of FIG. 4C, except that each set of switches S1-S12 includes a pair of switches (indicated by an "a" and a "b" designation). To avoid cluttering the drawing, the sets of switches S13-S16 from FIG. 4C are not added as differential pairs of switches to FIG. 5B, but the reader will understand how these sets of switches S13-S16 may be added to the reconfigurable DAC circuit 549. As for the additional switches illustrated in FIG. 5B, the ninth set of switches includes switches S9a and S9b, which may be coupled between the differential outputs of DAC 510 and the differential H_Real_IF1 outputs of the DAC circuit 549. Similarly, the tenth set of switches includes switches S10a and S10b coupled between the differential outputs of DAC 512 and the differential H_Real_IF2 outputs, the eleventh set of switches includes switches S11a and S11b coupled between the differential outputs of DAC 514 and the differential V_Real_IF1 outputs, and the twelfth set of switches includes switches S12a and S12b coupled between the differential outputs of DAC 516 and the differential V_Real_IF2 outputs.

Additional or alternative differential pairs of switches (e.g., sets of switches S13a/b-S16a/b (not shown) for coupling to the dual-layer quadrature (the legacy mmW) outputs of the reconfigurable DAC circuit 410C may be included in wireless transmitter circuit 500B, as indicated by the I_H, Q_H, I_V, and Q_V outputs shown in parentheses.

The MUX 555 (e.g., a 4:1 MUX) may receive clock signals from multiple sources (e.g., multiple frequency synthesizers, such as the TX frequency synthesizer 320 in FIG. 3) and select one of the received clock signals for outputting to the clock distribution circuit 513. This selection may be controlled by a control signal (e.g., from the controller 336) received by a control input of the MUX 555. In the example of FIG. 5B, the MUX 555 may receive a clock signal (labeled "Pll_sub6") corresponding to the sub-6 GHz frequency bands, a clock signal (labeled "Pll_mmW") corresponding to the mmW frequency bands, a clock signal (labeled "pll_real_IF") corresponding to the real-IF architecture, and a clock signal (labeled "pll_legacy_mmW") corresponding to the dual-layer quadrature (legacy mmW) scheme.

The sets of switches in the reconfigurable DAC circuit 549 of FIG. 5B may be operated in the same manner as the corresponding sets of switches S1-S12 (or S1-S16) in the reconfigurable DAC circuit 410C of FIG. 4C and need not be repeated here.

Figure 6C:
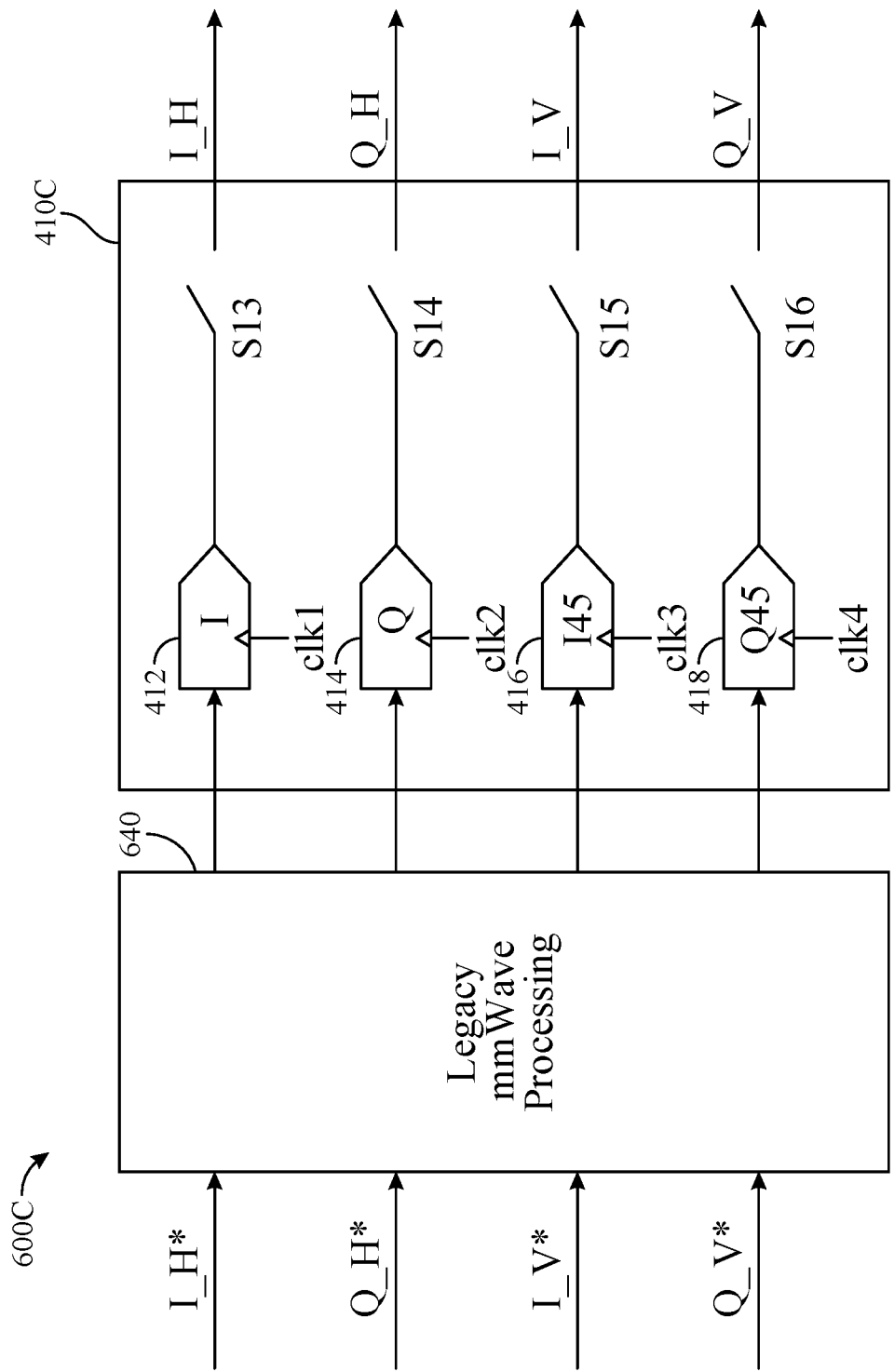
FIG. 6C is a block diagram of a portion of an example transmitter circuit with a reconfigurable DAC circuit, supporting a dual-layer quadrature scheme, in accordance with certain aspects of the present disclosure.

FIG. 6C is a block diagram of a portion of an example transmitter circuit 600C with the reconfigurable DAC circuit 410C implementing a dual-layer quadrature scheme (a legacy mmW scheme), in accordance with certain aspects of the present disclosure. A Legacy mmW processing circuitry 640 receives digital baseband signals-including an in-phase horizontal polarization baseband signal (I_H*), a quadrature horizontal polarization baseband signal (Q_H*), an in-phase vertical polarization baseband signal (I_V*), and a quadrature vertical polarization baseband signal (Q_V*)—and generates corresponding signals routed to the corresponding DACs of the reconfigurable DAC circuit 410C. The legacy mmW processing circuitry 640 of FIG. 6C may thus represent the legacy mmW processing circuitry 546, the MUX 506, and the processing circuitry 508 of FIG. 5B. As described above, the sets of switches S13-S16 may be closed (where the other sets of switches S1-S12 may be open), and each DAC outputs a signal that is routed to a corresponding transmit chain (not shown) for legacy mmW (for a dual-layer quadrature scheme).

Figure 6D:
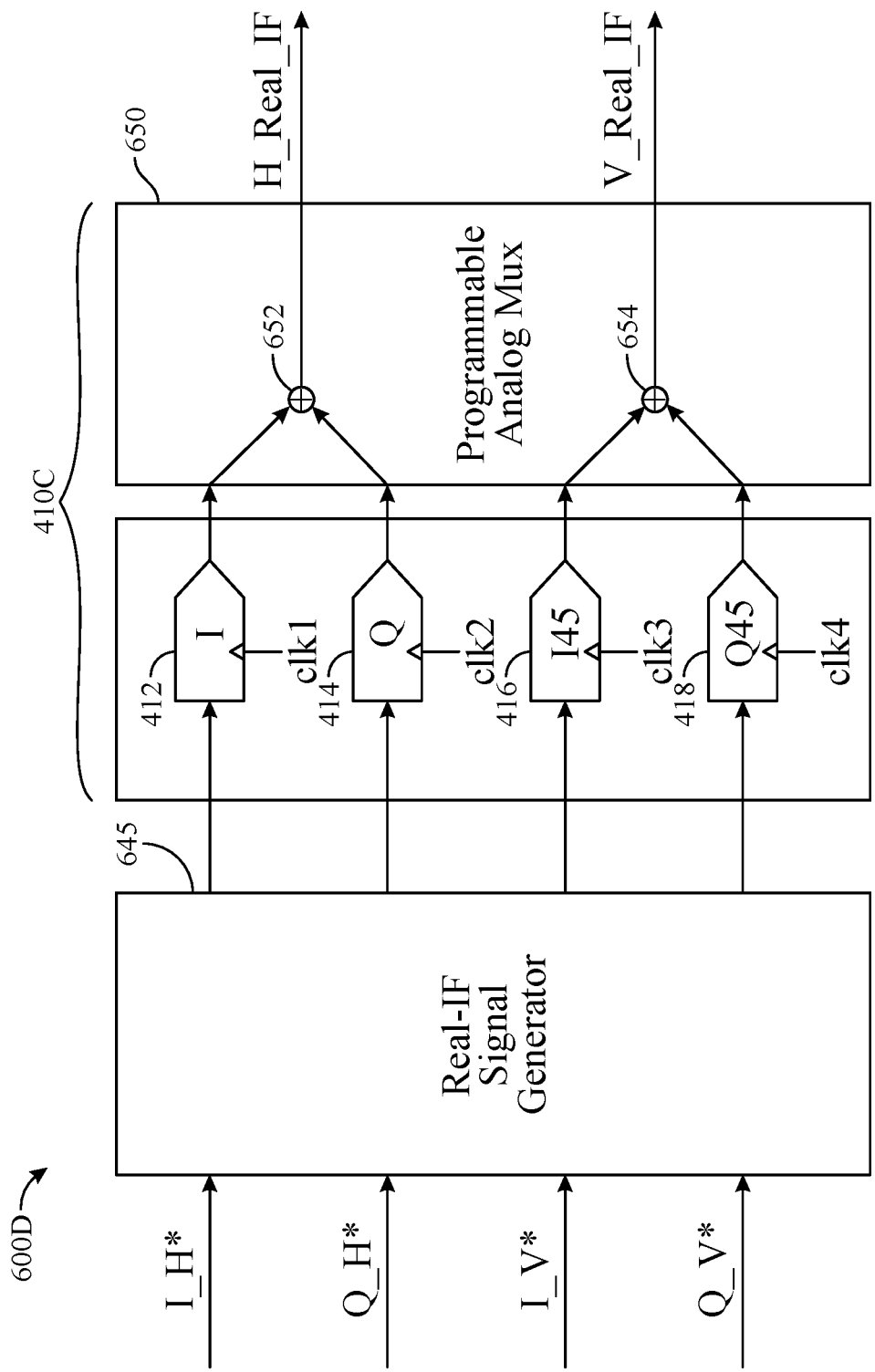
FIG. 6D is a block diagram of a portion of an example transmitter circuit with a reconfigurable DAC circuit, supporting a dual-layer real-intermediate-frequency (IF) scheme with interleaving, in accordance with certain aspects of the present disclosure.

FIG. 6D is a block diagram of a portion of an example transmitter circuit 600D with the reconfigurable DAC circuit 410C, implementing a dual-layer real-IF scheme with interleaving, in accordance with certain aspects of the present disclosure. In this case, a real-IF signal generator 645 receives the digital baseband signals described above and generates corresponding real-IF output signals routed to the corresponding DACs of the reconfigurable DAC circuit 410C. The real-IF signal generator 645 of FIG. 6D may thus represent the real-IF processing circuitry 544, the MUX 506, and the processing circuitry 508 of FIG. 5B. When using dual-layer real-IF with interleaving, the outputs of the DACs 412, 414, 416, 418 may be provided to a programmable analog MUX 650, which may include interleaver 652 and interleaver 654. Interleaver 652 may be configured to receive the outputs of DAC 412 and DAC 414. Interleaver 652 may be implemented by the sets of switches S9 and S10 and operated in the same manner described above, alternating between the two outputs in an interleaved fashion. This causes the real-IF horizontal polarization output (H_Real_IF) of the reconfigurable DAC circuit 410C to alternate between H_Real_IF1 from the output of DAC 412 and H_Real_IF2 from the output of DAC 414. Interleaver 654 may be configured to receive the outputs of DAC 416 and DAC 418. Interleaver 654 may be implemented by the sets of switches S11 and S12 and operated in the same manner described above, alternating between the two outputs in an interleaved fashion. This causes the real-IF vertical polarization output (V_Real_IF) of the reconfigurable DAC circuit 410C to alternate between V_Real_IF1 from the output of DAC 416 and V_Real_IF2 from the output of DAC 418.

Figure 6E:
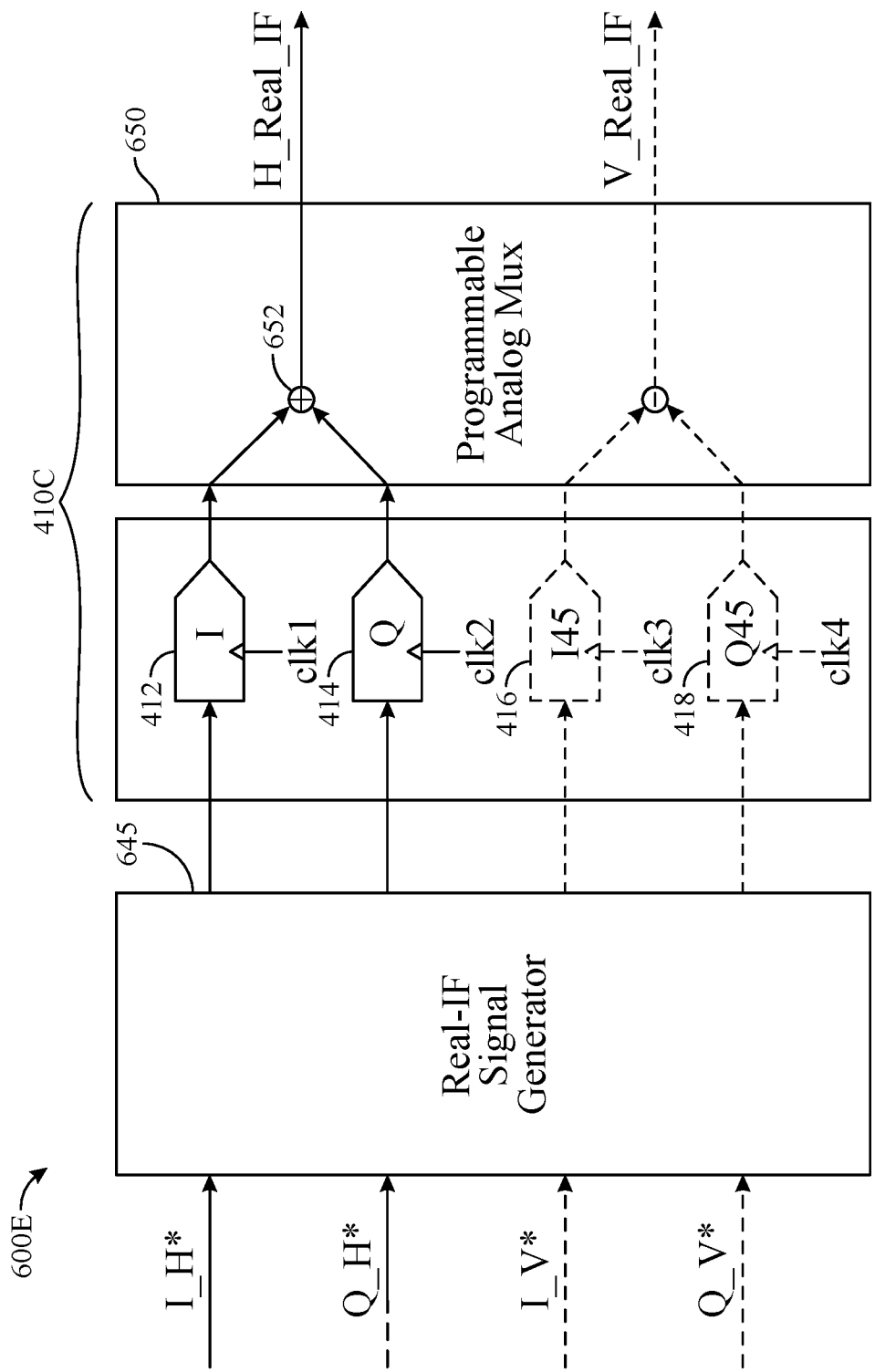
FIG. 6E is a block diagram of a portion of an example transmitter circuit with a reconfigurable DAC circuit, supporting a single-layer real-IF scheme with interleaving, in accordance with certain aspects of the present disclosure.

FIG. 6E is a block diagram of a portion of an example transmitter circuit 600E with the reconfigurable DAC circuit 410C, implementing a single-layer real-IF scheme with interleaving, in accordance with certain aspects of the present disclosure. In certain aspects, the single-layer real-IF scheme with interleaving may involve only outputting the real-IF horizontal polarization output (H_Real_IF) from the programmable analog MUX 650. In the example illustrated in FIG. 6E, only the horizontal baseband inputs may be received by the real-IF signal generator 645 and/or only DACs 412 and 414 and the interleaver 652 are enabled (i.e., DACs 416 and 418 and the interleaver 654 are disabled). Thus, only DAC 412 and DAC 414 may receive real-IF signals and generate analog IF output signals H_Real_IF1 and H_Real_IF2, respectively. Interleaver 652 may then operate in the same manner described above, where the output H_Real_IF will alternate between H_Real_IF1 and H_Real_IF2. Alternatively, the single-layer real-IF scheme may involve generating only the vertical polarization output V_Real_IF to a corresponding transmission chain (e.g., where DACs 412 and 414 and interleaver 652 are disabled and DACs 416 and 418 and interleaver 654 are enabled).

Figure 6F:
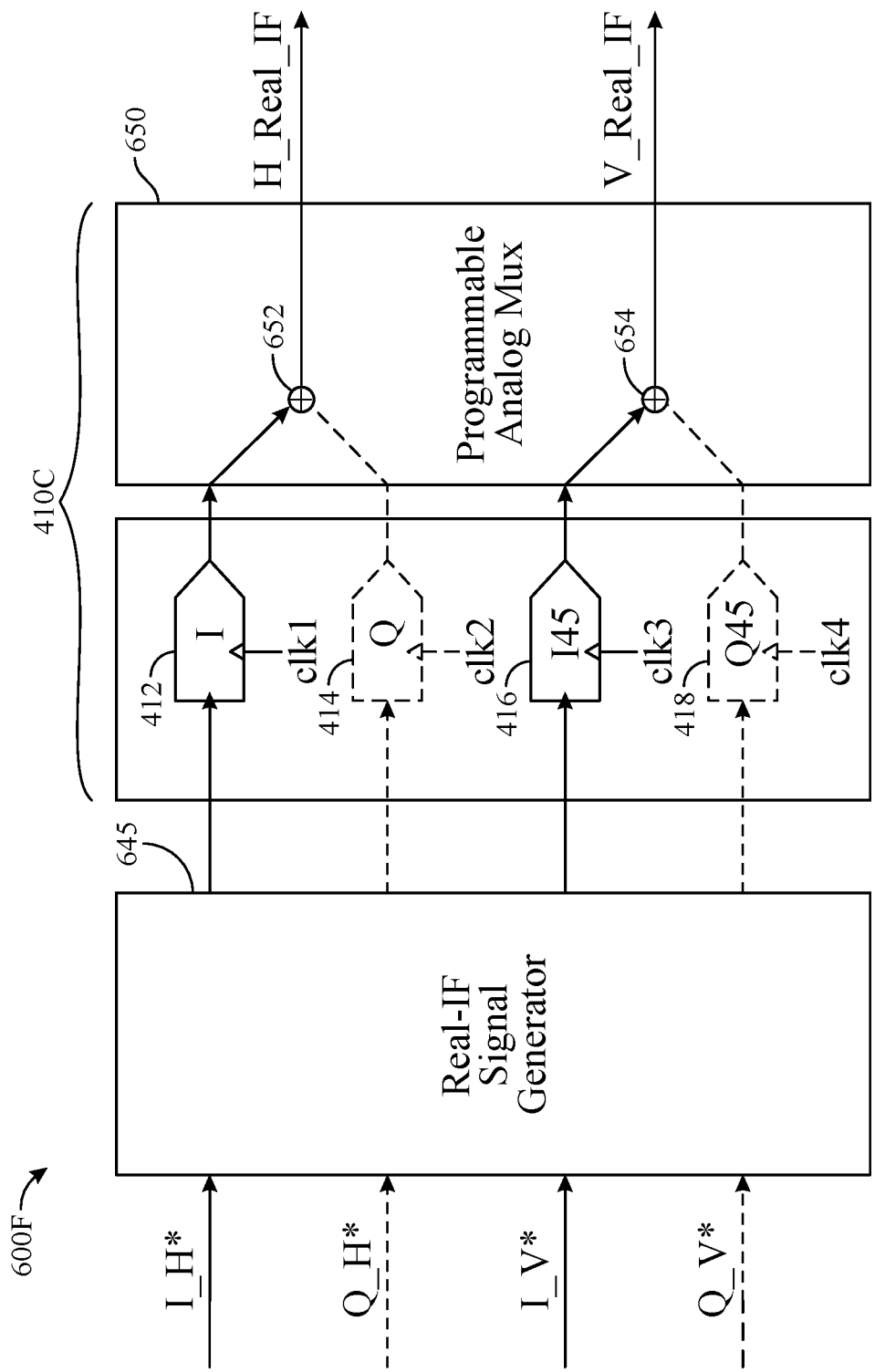
FIG. 6F is a block diagram of a portion of an example transmitter circuit with a reconfigurable DAC circuit, supporting a dual-layer real-IF scheme without interleaving, in accordance with certain aspects of the present disclosure.

FIG. 6F is a block diagram of a portion of an example transmitter circuit 600F with the reconfigurable DAC circuit 410C, implementing a dual-layer real-IF scheme without interleaving, in accordance with certain aspects of the present disclosure. Because the portion of the transmitter circuit 600F is using dual-layer real-IF, both the H_Real_IF and V_Real_IF outputs are generated and routed to a corresponding transmit chain. However, because interleaving is not used in this example, the real-IF signal generator 645 may only generate both in-phase real-IF signals (and/or only the DACs 412 and 416 are enabled as illustrated) or both quadrature real-IF signals (and/or only the DACs 414 and 418 are enabled). For example, as illustrated in FIG. 6F, the real-IF signal generator 645 may transmit the real-IF in-phase horizontal polarization signal to DAC 412 and the real-IF in-phase vertical polarization signal to DAC 416. The clock signals for the DACs (e.g., Clk1 and Clk3 for DACs 412 and 416, respectively) may be phase-shifted 90° in this case. The programmable analog MUX 650 may be selected (or effectively the sets of switches S9 and S11 may be closed) to route the outputs of the DACs 412 and 416 to the H_Real_IF and V_Real_IF outputs of the reconfigurable DAC circuit 410C. Alternatively, the real-IF signal generator 645 may transmit the real-IF quadrature horizontal polarization signal to DAC 414 and the real-IF quadrature vertical polarization signal to DAC 418, and the programmable analog MUX 650 may be selected (or effectively the sets of switches S10 and S12 may be closed) to route the outputs of the DACs 414 and 418 to the H_Real_IF and V_Real_IF outputs of the reconfigurable DAC circuit 410C.

Example Operations for Wireless Communication

Figure 7:
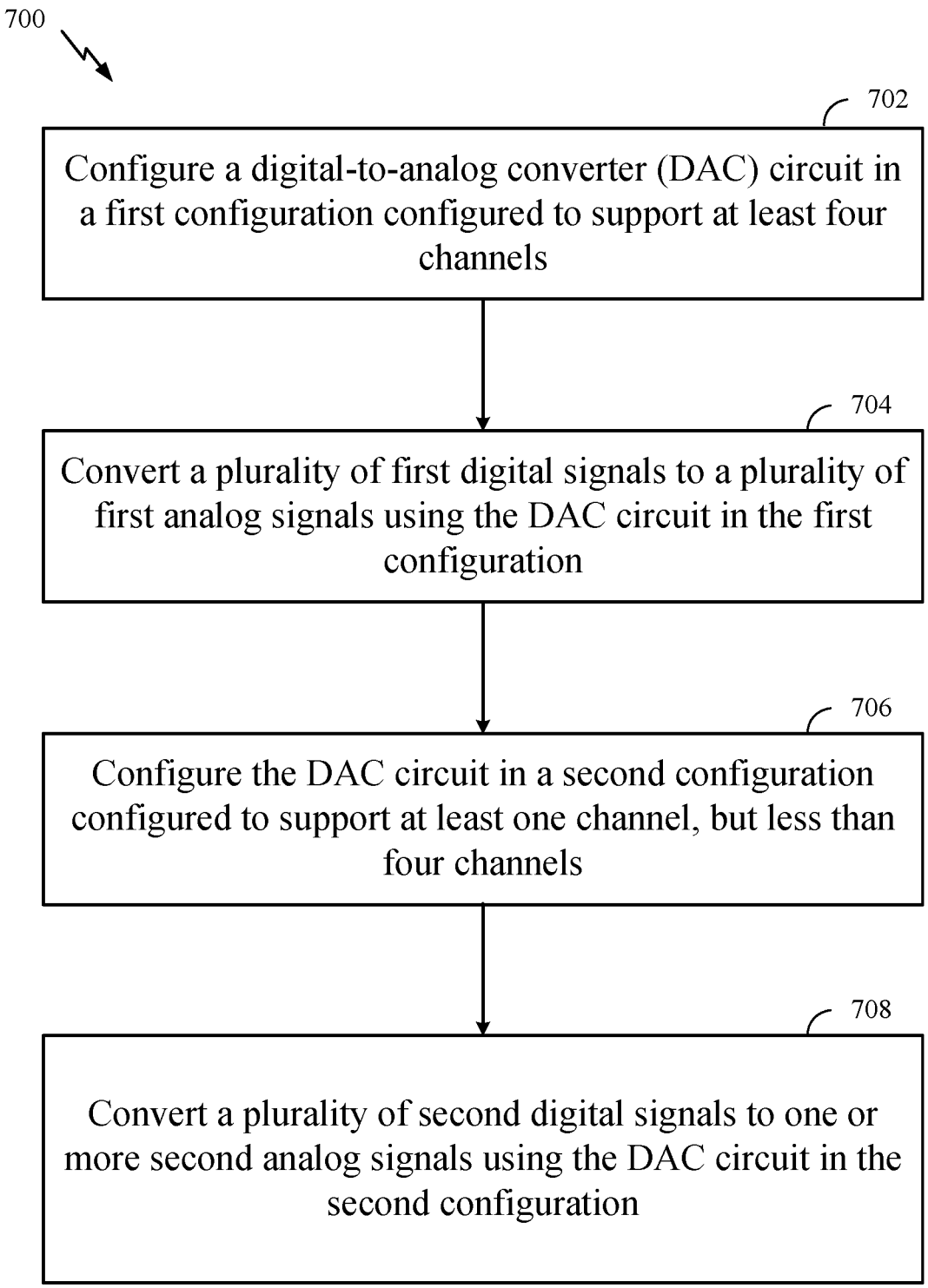
FIG. 7 is a flow diagram of example operations for wireless communication, in accordance with certain aspects of the present disclosure.

FIG. 7 is a flow diagram of example operations 700 for wireless communication, in accordance with certain aspects of the present disclosure. The operations 700 may be performed, for example, by a transmitter circuit (e.g., the transmitter circuit 500A or 500B of FIG. 5A or 5B, respectively) that utilizes a reconfigurable DAC circuit (e.g., reconfigurable DAC circuit 410B, 410C, 509, or 549 of FIG. 4B, 4C, 5A, or 5B, respectively) as described above.

The operations 700 may begin, at block 702, by configuring the DAC circuit in a first configuration configured to support at least four channels. At block 704, the DAC circuit in the first configuration may convert a plurality of first digital signals to a plurality of first analog signals.

At block 706, the DAC circuit may be configured in a second configuration configured to support at least one channel, but less than four channels. At block 708, the DAC circuit in the second configuration may convert a plurality of second digital signals to one or more second analog signals.

According to certain aspects, the plurality of first digital signals is in a first set of one or more frequency bands, and the plurality of second digital signals is in a second set of one or more frequency bands, different from the first set of one or more frequency bands. For example, the first set of one or more frequency bands may be one or more sub-6 GHz frequency bands, and the second set of one or more frequency bands may be one or more millimeter wave (mmW) frequency bands. As another example, the first set of one or more frequency bands may be one or more Frequency Range 1 (FR1) frequency bands, and the second set of one or more frequency bands may be one or more Frequency Range 2 (FR2) frequency bands.

According to certain aspects, the DAC circuit includes a plurality of switches coupled to outputs of at least four DACs. In this case, configuring the DAC circuit in the second configuration may involve selectively closing a first set of the plurality of switches and selectively opening a second set of the plurality of switches, different from the first set of the plurality of switches. For certain aspects, the selectively closing may involve selectively closing the first set of the plurality of switches for a first interval, and the selectively opening may involve selectively opening the second set of the plurality of switches for the first interval. In this case, configuring the DAC circuit in the second configuration may further include selectively closing a third set of the plurality of switches for a second interval, the third set being different from the first set of the plurality of switches, and selectively opening a fourth set of the plurality of switches for the second interval, the fourth set being different from the second set of the plurality of switches.

According to certain aspects, the plurality of second digital signals includes intermediate frequency (IF) digital signals. In this case, the DAC circuit may include at least four DACs capable of operating as IF DACs, and the at least one channel may be at least one real-IF channel.

Example Aspects

In addition to the various aspects described above, specific combinations of aspects are within the scope of the present disclosure, some of which are detailed below:

Aspect 1: A digital-to-analog converter (DAC) circuit comprising: a first DAC; a first set of one or more switches coupled between an output of the first DAC and a first output of the DAC circuit; a second DAC; a second set of one or more switches coupled between an output of the second DAC and a second output of the DAC circuit; a third DAC; a third set of one or more switches coupled between an output of the third DAC and a third output of the DAC circuit; a fourth DAC; a fourth set of one or more switches coupled between an output of the fourth DAC and a fourth output of the DAC circuit; a fifth set of one or more switches coupled between the output of the first DAC and a fifth output of the DAC circuit; a sixth set of one or more switches coupled between the output of the second DAC and the fifth output of the DAC circuit; a seventh set of one or more switches coupled between the output of the third DAC and a sixth output of the DAC circuit; and an eighth set of one or more switches coupled between the output of the fourth DAC and the sixth output of the DAC circuit.

Aspect 2: The DAC circuit of Aspect 1, wherein the first DAC is configured as an in-phase (I) DAC and wherein the second DAC is configured as a quadrature (Q) DAC.

Aspect 3: The DAC circuit of Aspect 1 or 2, wherein the first DAC is located adjacent to the second DAC.

Aspect 4: The DAC circuit of any of the preceding Aspects, wherein the third DAC is configured as a 45° phase-shifted (I45) DAC and wherein the fourth DAC is configured as a 135° phase-shifted quadrature (Q45) DAC.

Aspect 5: The DAC circuit of any of the preceding Aspects, wherein the third DAC is located adjacent to the fourth DAC.

Aspect 6: The DAC circuit of any of the preceding Aspects, wherein the first DAC is located adjacent to the second DAC.

Aspect 7: The DAC circuit of any of the preceding Aspects, further comprising: a clock distribution circuit; a first clock line coupled between a first output of the clock distribution circuit and a clock input of the first DAC; a second clock line coupled between a second output of the clock distribution circuit and a clock input of the second DAC; a third clock line coupled between a third output of the clock distribution circuit and a clock input of the third DAC; and a fourth clock line coupled between a fourth output of the clock distribution circuit and a clock input of the fourth DAC, wherein the first, second, third, and fourth outputs of the clock distribution circuit are all different outputs.

Aspect 8: The DAC circuit of Aspect 7, further comprising a multiplexer including an output coupled to an input of the clock distribution circuit and including multiple inputs configured to receive clock signals from different sources.

Aspect 9: The DAC circuit of any of the preceding Aspects, wherein the DAC circuit is configured to use the first, second, third, and fourth outputs with a first set of one or more frequency bands and wherein the DAC circuit is configured to use the fifth and sixth outputs with a second set of one or more frequency bands, different from the first set of one or more frequency bands.

Aspect 10: The DAC circuit of Aspect 9, wherein the first set of one or more frequency bands comprises one or more sub-6 GHz frequency bands and wherein the second set of one or more frequency bands comprises one or more millimeter wave (mmW) frequency bands.

Aspect 11: The DAC circuit of Aspect 9, wherein the first set of one or more frequency bands comprises one or more Frequency Range 1 (FR1) frequency bands and wherein the second set of one or more frequency bands comprises one or more Frequency Range 2 (FR2) frequency bands.

Aspect 12: The DAC circuit of Aspect 1 or any of Aspects 5-11, wherein: the first DAC is configured as an in-phase (I) DAC; the second DAC is configured as a 45° phase-shifted (I45) DAC; the third DAC is configured as a quadrature (Q) DAC; and the fourth DAC is configured as a 135° phase-shifted quadrature (Q45) DAC.

Aspect 13: The DAC circuit of Aspect 1 or any of Aspects 5-11, wherein: the first DAC is configured as an in-phase horizontal polarization (I_H) DAC; the second DAC is configured as a quadrature (Q) horizontal polarization (Q_H) DAC; the third DAC is configured as an in-phase vertical polarization (I_V) DAC; and the fourth DAC is configured as a quadrature (Q) vertical polarization (Q_V) DAC.

Aspect 14: The DAC circuit of any of the preceding Aspects, further comprising: a ninth set of one or more switches coupled between the output of the first DAC and a seventh output of the DAC circuit; and at least one of: a tenth set of one or more switches coupled between the output of the second DAC and the seventh output of the DAC circuit; or an eleventh set of one or more switches coupled between the output of the third DAC and an eighth output of the DAC circuit.

Aspect 15: The DAC circuit of Aspect 14, further comprising a twelfth set of one or more switches coupled between the output of the fourth DAC and the eighth output of the DAC circuit.

Aspect 16: The DAC circuit of Aspect 14 or 15, wherein the seventh output of the DAC circuit is a real intermediate frequency (real-IF) output.

Aspect 17: A wireless device comprising the DAC circuit of any of the preceding Aspects, the wireless device further comprising: a first mixer configured to receive a first oscillating signal; and a second mixer configured to receive a second oscillating signal, wherein the second oscillating signal is configured to be phase-shifted 90° with respect to the first oscillating signal.

Aspect 18: The wireless device of Aspect 17, wherein the fifth output of the DAC circuit is coupled to an input of the first mixer and wherein the sixth output of the DAC circuit is coupled to an input of the second mixer.

Aspect 19: The wireless device of Aspect 17 or 18, further comprising: a third mixer configured to receive a third oscillating signal; a fourth mixer configured to receive a fourth oscillating signal, wherein: the third oscillating signal is configured to be phase-shifted 45° with respect to the first oscillating signal; the fourth oscillating signal is configured to be phase-shifted 135° with respect to the first oscillating signal; the first output of the DAC circuit is coupled to an input of the first mixer; the second output of the DAC circuit is coupled to an input of the second mixer; the third output of the DAC circuit is coupled to an input of the third mixer; and the fourth output of the DAC circuit is coupled to an input of the fourth mixer.

Aspect 20: A digital-to-analog converter (DAC) circuit comprising: at least four DACs; and a plurality of switches coupled to outputs of the at least four DACs such that the DAC circuit is configured as a multi-channel DAC circuit with at least four channels for a first set of one or more frequency bands and is configured as an interleaved DAC circuit with at least two channels for a second set of one or more frequency bands, different from the first set of one or more frequency bands.

Aspect 21: The DAC circuit of Aspect 20, wherein the first set of one or more frequency bands comprises one or more sub-6 GHz frequency bands and wherein the second set of one or more frequency bands comprises one or more millimeter wave (mmW) frequency bands.

Aspect 22: The DAC circuit of Aspect 20, wherein the first set of one or more frequency bands comprises one or more Frequency Range 1 (FR1) frequency bands and wherein the second set of one or more frequency bands comprises one or more Frequency Range 2 (FR2) frequency bands.

Aspect 23: The DAC circuit of Aspect 20, wherein the DAC circuit is capable of operating as an intermediate frequency (IF) DAC circuit and wherein the plurality of switches are coupled to the outputs of the at least four DACs such that the DAC circuit is reconfigurable with at least one real-IF channel.

Aspect 24: A method of wireless communication, comprising: configuring a digital-to-analog converter (DAC) circuit in a first configuration configured to support at least four channels; converting a plurality of first digital signals to a plurality of first analog signals using the DAC circuit in the first configuration; configuring the DAC circuit in a second configuration configured to support at least one channel, but less than four channels; and converting a plurality of second digital signals to one or more second analog signals using the DAC circuit in the second configuration.

Aspect 25: The method of Aspect 24, wherein the plurality of first digital signals is in a first set of one or more frequency bands and wherein the plurality of second digital signals is in a second set of one or more frequency bands, different from the first set of one or more frequency bands.

Aspect 26: The method of Aspect 25, wherein the first set of one or more frequency bands comprises one or more sub-6 GHz frequency bands and wherein the second set of one or more frequency bands comprises one or more millimeter wave (mmW) frequency bands.

Aspect 27: The method of Aspect 25, wherein the first set of one or more frequency bands comprises one or more Frequency Range 1 (FR1) frequency bands and wherein the second set of one or more frequency bands comprises one or more Frequency Range 2 (FR2) frequency bands.

Aspect 28: The method of any of Aspects 24 to 27, wherein the DAC circuit comprises a plurality of switches coupled to outputs of at least four DACs and wherein configuring the DAC circuit in the second configuration comprises: selectively closing a first set of the plurality of switches; and selectively opening a second set of the plurality of switches, different from the first set of the plurality of switches.

Aspect 29: The method of Aspect 28, wherein: the selectively closing comprises selectively closing the first set of the plurality of switches for a first interval; the selectively opening comprises selectively opening the second set of the plurality of switches for the first interval; and configuring the DAC circuit in the second configuration further comprises: selectively closing a third set of the plurality of switches for a second interval, different from the first set of the plurality of switches; and selectively opening a fourth set of the plurality of switches for the second interval, different from the second set of the plurality of switches.

Aspect 30: The method of Aspect 24, wherein the plurality of second digital signals comprises intermediate frequency (IF) digital signals, wherein the DAC circuit comprises at least four DACs capable of operating as IF DACs, and wherein the at least one channel comprises at least one real-IF channel.

ADDITIONAL CONSIDERATIONS

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components. For example, means for converting may include a digital-to-analog converter (DAC) circuit, such as the reconfigurable DAC circuit 410B or 410C of FIG. 4B or 4C, respectively.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A digital-to-analog converter (DAC) circuit comprising:
   a first DAC;
   a first set of one or more switches coupled between an output of the first DAC and a first output of the DAC circuit;
   a second DAC;
   a second set of one or more switches coupled between an output of the second DAC and a second output of the DAC circuit;
   a third DAC;
   a third set of one or more switches coupled between an output of the third DAC and a third output of the DAC circuit;
   a fourth DAC;
   a fourth set of one or more switches coupled between an output of the fourth DAC and a fourth output of the DAC circuit;
   a fifth set of one or more switches coupled between the output of the first DAC and a fifth output of the DAC circuit;
   a sixth set of one or more switches coupled between the output of the second DAC and the fifth output of the DAC circuit;
   a seventh set of one or more switches coupled between the output of the third DAC and a sixth output of the DAC circuit; and
   an eighth set of one or more switches coupled between the output of the fourth DAC and the sixth output of the DAC circuit, wherein the DAC circuit is configured to:
   use the first, second, third, and fourth outputs with a first set of one or more frequency bands; and
   use the fifth and sixth outputs with a second set of one or more frequency bands, different from the first set of one or more frequency bands.

2. The DAC circuit of claim 1, wherein:
   the first DAC is configured as an in-phase (I) DAC; and
   the second DAC is configured as a quadrature (Q) DAC.

3. The DAC circuit of claim 2, wherein the first DAC is located adjacent to the second DAC.

4. The DAC circuit of claim 2, wherein;
   the third DAC is configured as a 45° phase-shifted (I45) DAC; and
   the fourth DAC is configured as a 135° phase-shifted quadrature (Q45) DAC.

5. The DAC circuit of claim 4, wherein the third DAC is located adjacent to the fourth DAC.

6. The DAC circuit of claim 5, wherein the first DAC is located adjacent to the second DAC.

7. The DAC circuit of claim 1, further comprising:
   a clock distribution circuit;
   a first clock line coupled between a first output of the clock distribution circuit and a clock input of the first DAC;
   a second clock line coupled between a second output of the clock distribution circuit and a clock input of the second DAC;

a third clock line coupled between a third output of the clock distribution circuit and a clock input of the third DAC; and a fourth clock line coupled between a fourth output of the clock distribution circuit and a clock input of the fourth DAC, wherein the first, second, third, and fourth outputs of the clock distribution circuit are all different outputs.

8. The DAC circuit of claim 7, further comprising a multiplexer including:

an output coupled to an input of the clock distribution circuit; and multiple inputs configured to receive clock signals from different sources.

9. The DAC circuit of claim 1, wherein:

the first set of one or more frequency bands comprises one or more sub-6 GHz frequency bands; and the second set of one or more frequency bands comprises one or more millimeter wave (mmW) frequency bands.

10. The DAC circuit of claim 1, wherein:

the first set of one or more frequency bands comprises one or more Frequency Range 1 (FR1) frequency bands; and the second set of one or more frequency bands comprises one or more Frequency Range 2 (FR2) frequency bands.

11. The DAC circuit of claim 1, wherein:

the first DAC is configured as an in-phase (I) DAC;

the second DAC is configured as a 45° phase-shifted (I45) DAC;

the third DAC is configured as a quadrature (Q) DAC; and the fourth DAC is configured as a 135° phase-shifted quadrature (Q45) DAC.

12. The DAC circuit of claim 1, wherein:

the first DAC is configured as an in-phase horizontal polarization (I_H) DAC;

the second DAC is configured as a quadrature (Q) horizontal polarization (Q_H) DAC;

the third DAC is configured as an in-phase vertical polarization (I_V) DAC; and the fourth DAC is configured as a quadrature (Q) vertical polarization (Q_V) DAC.

13. The DAC circuit of claim 1, further comprising:

a ninth set of one or more switches coupled between the output of the first DAC and a seventh output of the DAC circuit; and at least one of:

a tenth set of one or more switches coupled between the output of the second DAC and the seventh output of the DAC circuit; or an eleventh set of one or more switches coupled between the output of the third DAC and an eighth output of the DAC circuit.

14. The DAC circuit of claim 13, further comprising a twelfth set of one or more switches coupled between the output of the fourth DAC and the eighth output of the DAC circuit.

15. The DAC circuit of claim 13, wherein the seventh output of the DAC circuit is a real intermediate frequency (real-IF) output.

16. A wireless device comprising the DAC circuit of claim 1, the wireless device further comprising:

a first mixer configured to receive a first oscillating signal; and a second mixer configured to receive a second oscillating signal, wherein the second oscillating signal is configured to be phase-shifted 90° with respect to the first oscillating signal.

17. The wireless device of claim 16, wherein:

the fifth output of the DAC circuit is coupled to an input of the first mixer; and the sixth output of the DAC circuit is coupled to an input of the second mixer.

18. The wireless device of claim 17, further comprising:

a third mixer configured to receive a third oscillating signal; and a fourth mixer configured to receive a fourth oscillating signal, wherein:

the third oscillating signal is configured to be phase-shifted 45° with respect to the first oscillating signal;

the fourth oscillating signal is configured to be phase-shifted 135° with respect to the first oscillating signal;

the first output of the DAC circuit is coupled to an input of the first mixer;

the second output of the DAC circuit is coupled to an input of the second mixer;

the third output of the DAC circuit is coupled to an input of the third mixer; and the fourth output of the DAC circuit is coupled to an input of the fourth mixer.

19. A digital-to-analog converter (DAC) circuit comprising:

at least four DACs; and a plurality of switches coupled to outputs of the at least four DACs such that the DAC circuit is configured as a multi-channel DAC circuit with at least four channels for a first set of one or more frequency bands and is configured as an interleaved DAC circuit with at least two channels for a second set of one or more frequency bands, different from the first set of one or more frequency bands.

20. The DAC circuit of claim 19, wherein:

the first set of one or more frequency bands comprises one or more sub-6 GHz frequency bands; and the second set of one or more frequency bands comprises one or more millimeter wave (mmW) frequency bands.

21. The DAC circuit of claim 20, wherein:

the first set of one or more frequency bands comprises one or more Frequency Range 1 (FR1) frequency bands; and the second set of one or more frequency bands comprises one or more Frequency Range 2 (FR2) frequency bands.

22. The DAC circuit of claim 19, wherein:

the DAC circuit is capable of operating as an intermediate frequency (IF) DAC circuit; and the plurality of switches are coupled to the outputs of the at least four DACs such that the DAC circuit is reconfigurable with at least one real-IF channel.

23. A method of wireless communication, the method comprising:

configuring a digital-to-analog converter (DAC) circuit in a first configuration configured to support at least four channels;

converting a plurality of first digital signals to a plurality of first analog signals using the DAC circuit in the first configuration;

configuring the DAC circuit in a second configuration configured to support at least one channel, but less than four channels; and converting a plurality of second digital signals to one or more second analog signals using the DAC circuit in the second configuration.

24. The method of claim 23, wherein:
the plurality of first digital signals is in a first set of one or more frequency bands; and
the plurality of second digital signals is in a second set of one or more frequency bands, different from the first set of one or more frequency bands.

25. The method of claim 24, wherein:
the first set of one or more frequency bands comprises one or more sub-6 GHz frequency bands; and
the second set of one or more frequency bands comprises one or more millimeter wave (mmW) frequency bands.

26. The method of claim 24, wherein;
the first set of one or more frequency bands comprises one or more Frequency Range 1 (FR1) frequency bands; and
wherein the second set of one or more frequency bands comprises one or more Frequency Range 2 (FR2) frequency bands.

27. The method of claim 23, wherein:
the DAC circuit comprises a plurality of switches coupled to outputs of at least four DACs; and
configuring the DAC circuit in the second configuration comprises:
selectively closing a first set of the plurality of switches; and
selectively opening a second set of the plurality of switches, different from the first set of the plurality of switches.

28. The method of claim 27, wherein:
the selectively closing comprises selectively closing the first set of the plurality of switches for a first interval;
the selectively opening comprises selectively opening the second set of the plurality of switches for the first interval; and
configuring the DAC circuit in the second configuration further comprises:
selectively closing a third set of the plurality of switches for a second interval, different from the first set of the plurality of switches; and
selectively opening a fourth set of the plurality of switches for the second interval, different from the second set of the plurality of switches.

29. The method of claim 23, wherein:
the plurality of second digital signals comprises intermediate frequency (IF) digital signals;
the DAC circuit comprises at least four DACs capable of operating as IF DACs; and
the at least one channel comprises at least one real-IF channel.

* * * * *